United States Patent
Kikuchi et al.

(10) Patent No.: US 6,891,247 B2
(45) Date of Patent: May 10, 2005

(54) SEMICONDUCTOR DEVICE INCLUDING SEMICONDUCTOR BARE CHIP MOUNTED BY FLIP-CHIP BONDING, AND BOARD MEMBER WITH THIN-FILM STRUCTURE CAPACITOR FOR SEMICONDUCTOR BARE CHIP MOUNTED BY FLIP-CHIP BONDING

(75) Inventors: Shunichi Kikuchi, Kawasaki (JP); Misao Umematsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/177,672

(22) Filed: Jun. 24, 2002

(65) Prior Publication Data

US 2002/0171153 A1 Nov. 21, 2002

Related U.S. Application Data

(63) Continuation of application No. PCT/JP99/07257, filed on Dec. 24, 1999.

(51) Int. Cl.$^7$ .............................................. H01L 29/00
(52) U.S. Cl. ...................... 257/532; 257/534; 257/924; 257/300; 257/778; 257/758; 257/700; 361/301.4; 361/306.2; 361/298.4; 361/307; 361/321.4; 361/321.5
(58) Field of Search ................................ 257/532, 534, 257/300, 924, 758–766, 700, 701, 778; 361/301.4, 306.2, 298.4, 307, 321.4, 321.5

(56) References Cited

U.S. PATENT DOCUMENTS

| 5,067,005 | A | | 11/1991 | Michii et al. ................. 357/72 |
| 5,475,565 | A | * | 12/1995 | Bhattacharyya et al. .... 361/719 |
| 5,528,083 | A | * | 6/1996 | Malladi et al. ............. 257/786 |
| 5,895,966 | A | * | 4/1999 | Penchuk ..................... 257/690 |
| 5,982,018 | A | * | 11/1999 | Wark et al. ................. 257/532 |
| 6,184,567 | B1 | * | 2/2001 | Fujisawa et al. ............ 257/532 |
| 6,191,479 | B1 | * | 2/2001 | Herrell et al. .............. 257/724 |

FOREIGN PATENT DOCUMENTS

| JP | 03-083368 | | 4/1991 |
| JP | 04-211191 | | 8/1992 |
| JP | 4-211191 | | 8/1992 |
| JP | 05-343603 | | 12/1993 |
| JP | 5-343603 | | 12/1993 |
| JP | 08-10744 | | 1/1996 |
| JP | 08-181245 | | 7/1996 |
| JP | 8-181245 | | 7/1996 |
| JP | 08181245 | A * | 7/1996 |
| JP | 10-294331 | | 11/1998 |

* cited by examiner

Primary Examiner—Tom Thomas
Assistant Examiner—Chris C. Chu
(74) Attorney, Agent, or Firm—Armstrong, Kratz, Quintos, Hanson & Brooks, LLP

(57) ABSTRACT

A semiconductor device includes a semiconductor bare chip and an electrically-insulative board member with a thin-film structure capacitor. The semiconductor bare chip has a power supply terminal and a grounding terminal on the back surface thereof. The semiconductor bare chip is mounted on a circuit board by flip-chip bonding. The board member includes a board and a thin-film structure capacitor provided on the board. The capacitor has terminals corresponding to the power supply terminal and the grounding terminal of the semiconductor bare chip thereon. The side of the board member where the capacitor is provided is bonded to the back surface of the semiconductor bare chip. The terminals of the capacitor are electrically connected to the power supply terminal and the grounding terminal of the semiconductor bare chip.

7 Claims, 23 Drawing Sheets

SEMICONDUCTOR DEVICE INCLUDING SEMICONDUCTOR BARE CHIP MOUNTED BY FLIP-CHIP BONDING, AND BOARD MEMBER WITH THIN-FILM STRUCTURE CAPACITOR FOR SEMICONDUCTOR BARE CHIP MOUNTED BY FLIP-CHIP BONDING

This application is a continuation of International Application PCT/JP99/07257 filed Dec. 24, 1999.

BACKGROUND OF THE INVENTION

Field of the Invention

The present invention relates to a semiconductor device including a semiconductor bare chip mounted by flip-chip bonding, and to a board member having a thin-film structure capacitor for a semiconductor bare chip mounted by flip-chip bonding. More specifically, the present invention relates to a semiconductor device having a semiconductor bare chip mounted by flip-chip bonding, wherein the VG impedance in the high frequency region on the GHz order is made low, the influence of the AC noise voltage in the high frequency region is reduced and the reliability of operation is increased. Moreover, the present invention relates to a board member having a thin-film structure capacitor for a semiconductor bare chip mounted by flip-chip bonding, wherein the VG impedance in the high frequency region on the GHz order is made low, the influence of AC noise in the high frequency region is reduced and the reliability of operation is increased.

In recent years, the CMOS type LSI has been dominantly used, instead of the existing ECL type LSI, as a semiconductor device that realizes high integration and low power consumption. The power consumption "P" of the CMOS type LSI is represented by the following formula:

$$P \propto C \cdot f \cdot V^2$$

wherein "C" is the characteristic value determined by the floating capacitance and the floating inductance of the wiring, "f" is the operating frequency, and "V" is the operating power supply voltage.

Moreover, in recent years, there is a demand for improvement of the performance of electronic devices in which the CMOS type LSI is incorporated. In order to meet the demand, high integration of the CMOS type LSI is needed and an increase of the operating frequency thereof from 75 MHz or 100 MHz to 1 GHz or 3 GHz is desired.

In the CMOS type LSI, if the high integration is attained, the number of transistors in the CMOS type LSI will be increased, and the power consumption of the CMOS type LSI will be increases. Moreover, if the operating frequency thereof is raised to attain improvement of the speed, the power consumption of the CMOS type LSI will be increased in proportion to the operating frequency.

A description will now be given of reduction of the power consumption of the CMOS type LSI and reduction of the power consumption of a semiconductor device having the CMOS type LSI.

As for the CMOS type LSI, it is planned to shorten the gate length of the transistors provided therein so that the amount of current flowing through the transistors is reduced, thereby reducing the power consumption.

As for the semiconductor device having the CMOS type LSI, it is planned to lower the operating power supply voltage from 5 V or 5.5 V to 1.5 V or 1 V, thereby reducing the power consumption. As is apparent from the above formula of the power consumption P, the reduction of the operating power supply voltage is effective in reducing the power consumption.

It is demanded that the semiconductor device operates with high reliability and malfunction of the semiconductor device does not occur. One of major causes of malfunction of the semiconductor device is the AC noise voltage that is generated partially in the power supply layer by the electromagnetism when the signal current flows. In the semiconductor device, the signal current greatly increases at the time of the start of operation, and the AC noise voltage is the maximum at the time of the start of operation of the semiconductor device. The AC noise voltage (V) is represented by the following formula:

AC noise voltage $(V)$=VG impedance $Z$ $(\Omega)$×Current increase value $(A)$ wherein the VG impedance Z is the impedance between the power supply terminal and the grounding terminal of the semiconductor device.

Hereinafter, the value of the AC noise voltage that does not cause a malfunction of the semiconductor device is called a permissible AC noise voltage.

If the operating power supply voltage is reduced as mentioned above, the permissible AC noise voltage is reduced accordingly. As is apparent from the above formula of the AC noise voltage, in order to make the AC noise voltage lower than the permissible AC noise voltage, it is necessary to make the VG impedance Z in an operating frequency region small.

Generally, the VG impedance Z of a capacitor is represented by the following formula:

$$Z = R + j\omega L + \frac{1}{j\omega C}$$

wherein "L" is the floating inductance and "C" is the capacitance.

The frequency characteristic of the VG impedance Z of a capacitor is shown in FIG. 21. It is in a V-shaped form as indicated by the line XX in FIG. 21. The shifting of the downward slanting line segment XXa is governed by the capacitance C while the shifting of the upward slanting line segment XXb is governed by the floating inductance L. If the capacitance C is only increased, the line of the frequency characteristic is shifted in the direction indicated by the arrow Y. If the floating inductance L is only decreased, the line of the frequency characteristic is shifted in the direction indicated by the arrow X.

Description of the Related Art

FIG. 1 shows a conventional semiconductor device 10. The semiconductor device 10 includes a CMOS type LSI semiconductor bare chip 11 having bumps 12 arranged on the back surface thereof, a circuit board 13 having solder balls 14 arranged on the back surface thereof, a heat dissipating plate 16, a heat sink 17, an aluminum electrolytic capacitor 18, a tantalum capacitor 19, and a ceramic capacitor 20.

The CMOS type LSI semiconductor bare chip 11 is mounted on the circuit board 13 by flip-chip bonding using the bumps 12. The circuit board 13 is mounted on a main board 15 using the solder balls 14. The heat dissipating plate 16 is fixed to the top surface of the semiconductor bare chip 11 by using a thermally conductive bonding material 21. Furthermore, the heat sink 17 is fixed to the top surface of the heat dissipating plate 16 by using a thermally conductive bonding material 22.

The aluminum electrolytic capacitor 18 and the tantalum capacitor 19 are mounted on the main board 15. The ceramic capacitor 20 is mounted on the circuit board 13.

In order to lower the VG impedance Z, the aluminum electrolytic capacitor 18, the tantalum capacitor 19 and the ceramic capacitor 20 are connected between a power supply terminal 24 and a grounding terminal 25 of the semiconductor bare chip 11 as shown in FIG. 2. The frequency band in which the VG impedance of the capacitor is kept low is determined by the floating inductance of the capacitor. Namely, the frequency band in which the capacitor operates effectively is determined by the floating inductance of the capacitor.

The aluminum electrolytic capacitor 18 has a large capacitance, and the floating inductance thereof is large. The tantalum capacitor 19 has an intermediate capacitance, and the floating inductance thereof is intermediate. The ceramic capacitor 20 has a small capacitance, and the floating inductance thereof is small.

Because the floating inductance of the aluminum electrolytic capacitor 18 is large, and the frequency band in which the capacitor operates effectively is low. The frequency characteristic of the VG impedance Z of the aluminum electrolytic capacitor 18 is indicated by the line I in FIG. 3, as being apparent from FIG. 21. Specifically, the VG impedance Z of the aluminum electrolytic capacitor 18 in the low frequency region is kept low.

Because the floating inductance of the tantalum capacitor 19 is intermediate, the frequency band in which the capacitor operates effectively is relatively high. The line II in FIG. 3 indicates the frequency characteristic of the VG impedance Z of the tantalum capacitor 19. The VG impedance Z of the tantalum capacitor 19 in the intermediate frequency band is kept low.

Because the floating inductance of the ceramic capacitor 20 is small, the frequency band in which the capacitor operates effectively is still higher. The line III in FIG. 3 indicates the frequency characteristic of the VG impedance Z of the ceramic capacitor 20. The VG impedance Z of the ceramic capacitor 20 in the high frequency band on the order of several 10 MHz is kept low.

Moreover, the semiconductor bare chip 11 includes a built-in capacitor, which is internally formed with the thin layers of the semiconductor bare chip 11. Since the built-in capacitor of the semiconductor bare chip 11 has a very small floating inductance, the frequency band in which the capacitor operates effectively is still higher. The frequency characteristics of the VG impedance Z of the built-in capacitor of the semiconductor bare chip is indicated by the line IV in FIG. 3. The VG impedance Z of the built-in capacitor in the high frequency band higher than the order of several 10 MHz is kept low.

The frequency characteristic of the VG impedance Z of the semiconductor device 10 can be obtained by the superimposition of the frequency characteristics of the VG impedances of the respective capacitors indicated by the lines I, II, III and IV in FIG. 4. The line V in FIG. 4 indicates the frequency characteristic of the VG impedance Z of the semiconductor device 10. In FIG. 4, reference numeral 26 indicates the use frequency region.

In the semiconductor device 10 having the structure mentioned above, when the operating power supply voltage is lowered from 5 V or 5.5 V to 1.5 V or 1 V, the permissible AC noise voltage becomes a low value as indicated by the line VI in FIG. 4. The improvement of the frequency band indicated by reference numeral 27 in FIG. 4 is needed.

When the CMOS type LSI is configured in the structure wherein the semiconductor bare chip is packaged by using a synthetic resin and the lead terminals project from the package, the inductance of the lead terminals is large, and the VG impedance is raised at a certain frequency in the use frequency band 26. For this reason, it is difficult for the CMOS type LSI to meet the above-described demand.

To eliminate the problem, it is desired that the CMOS type LSI be configured to have the structure that can make the inductance low. In other words, it is desired that the CMOS type LSI is configured to the structure that can have the semiconductor bare chip mounted by flip-chip bonding. Moreover, in the flip-chip bonding, the bumps are arranged on the back surface of the semiconductor bare chip, and the number of the bumps in the semiconductor bare chip can easily be increased. The flip-chip bonding can also contribute to high integration of the CMOS type LSI.

SUMMARY OF THE INVENTION

A general object of the present invention is to provide a semiconductor device including a semiconductor bare chip mounted by flip-chip bonding in which the above-described problems are eliminated, as well as a board member with a thin-film structure capacitor for a semiconductor bare chip mounted by flip-chip bonding in which the above-described problems are eliminated.

Another more specific object of the present invention is to provide a semiconductor device that cannot be easily affected by the AC noise voltage when the operating power supply voltage is lowered and the operating frequency is raised to the high frequency region.

The above-mentioned object of the present invention is achieved by a semiconductor device which comprises: a semiconductor bare chip which is mounted on a circuit board by flip-chip bonding; and a board member which includes a board and a thin-film structure capacitor formed on a surface of the board, the board member being arranged so that the thin-film structure capacitor is bonded to a back surface of the semiconductor bare chip, and the thin-film structure capacitor being electrically connected between a power supply terminal and a grounding terminal of the semiconductor bare chip.

The semiconductor device tends to receive the influence of the AC noise voltage when the operating frequency is in the high frequency region or when the operating power supply voltage is low. As previously described, low power consumption of the semiconductor device is currently demanded and the operating power supply voltage is lowered to 1.5 V. Moreover, the improvement in the operating speed is required, and it is desired to raise the operating speed of the semiconductor device to 1 GHz or higher.

In the semiconductor device of the present invention, the thin-film structure capacitor is arranged close to the semiconductor bare chip. In addition, the thin-film structure capacitor is formed as a thin layer, and the path between the power supply layer and the grounding layer is extremely short. Hence, the inductance between the power supply terminal and the grounding terminal is extremely low. For this reason, the VG impedance of the semiconductor device of the present invention in the high frequency region on the GHz order can be lowered. Therefore, the AC noise voltage in the high frequency region on the GHz order can be reduced. Even when the operating power supply voltage is lowered, it can effectively prevent the occurrence of a malfunction of the semiconductor device in the high frequency region on the GHz order.

Moreover, in the semiconductor device of the present invention, the thin-film structure capacitor is arranged close to the semiconductor bare chip, and the portion of the semiconductor device where the thin-film structure capacitor and the semiconductor bare chip are electrically connected together is not easily affected by the AC noise voltage in the low frequency region.

Furthermore, the circuit board, the board member and the thin-film structure capacitor are produced separately from one another. The formation of the thin-film structure capacitor does not affect the yield of the manufacture of the circuit board and the board member.

Another more specific object of the present invention is to provide a semiconductor device which has an improved resistance to the AC noise voltage when the operating power supply voltage is lowered and the operating frequency is raised to the high frequency region.

The above-mentioned object of the present invention is achieved by a semiconductor device comprising: a semiconductor bare chip which is mounted on a circuit board by flip-chip bonding, the semiconductor bare chip having a power supply terminal and a grounding terminal on a back surface thereof; and a board member which includes a board and a thin-film structure capacitor formed on a surface of the board, the thin-film structure capacitor having terminals, on a surface of the capacitor, which correspond to the power supply terminal and the grounding terminal of the semiconductor bare chip, wherein the board member is arranged so that the terminals of the thin-film structure capacitor are electrically connected to the power supply terminal and the grounding terminal of the semiconductor bare chip, and the thin-film structure capacitor is bonded to the back surface of the semiconductor bare chip.

In the semiconductor device of the present invention, the thin-film structure capacitor has the terminals on the surface of the capacitor, which correspond to the power supply terminal and the grounding terminal of the semiconductor bare chip, the board member being arranged so that the terminals of the thin-film structure capacitor are electrically connected to the power supply terminal and the grounding terminal on the back surface of the semiconductor bare chip. The electrical connections are substantially in the direction of the thickness, and the paths of the electrical connections are short. Hence, the floating inductance of the thin-film structure capacitor is small. For this reason, the VG impedance of the semiconductor device in the high frequency region on the GHz order can be lowered, and the AC noise voltage in the high frequency region on the GHz order can be lowered. Accordingly, when the operating power supply voltage is lowered, the semiconductor device of the present invention can effectively prevent the occurrence of a malfunction in the high frequency region.

The paths of the electrical connections between the thin-film capacitor and the semiconductor bare chip are extremely short, and the portion of the semiconductor device where the electrical connections are made is not easily affected by the AC noise voltage in the low frequency region.

Another more specific object of the present invention is to provide a semiconductor device in which the frequency band that cannot be easily affected by the AC noise voltage when the operating power supply voltage is lowered and the operating frequency is raised to the high frequency region is extended to the use frequency region.

The above-mentioned object of the present invention is achieved by a semiconductor device comprising: semiconductor device comprising: a semiconductor bare chip which is mounted on a circuit board by flip-chip bonding, the semiconductor bare chip having a power supply terminal and a grounding terminal on a back surface thereof; and a board member which includes a board and a thin-film structure capacitor formed on a surface of the board, the thin-film structure capacitor having terminals, on a surface of the capacitor, which correspond to the power supply terminal and the grounding terminal of the semiconductor bare chip, wherein the board member is arranged so that the terminals of the thin-film structure capacitor are electrically connected to the power supply terminal and the grounding terminal of the semiconductor bare chip, and the thin-film structure capacitor is bonded to the back surface of the semiconductor bare chip, and wherein the semiconductor device further comprises a second capacitor which is mounted on the circuit board and electrically connected between the power supply terminal and the grounding terminal of the semiconductor bare chip.

In the semiconductor device of the present invention, the second capacitor serves to lower the VG impedance of the semiconductor device in the low frequency region, and the semiconductor device is not easily affected by the AC noise voltage in the entire range of the operating frequency. Accordingly, when the operating power supply voltage is lowered, the semiconductor device of the present invention can effectively prevent the occurrence of a malfunction in the entire range of the use frequency band.

Another more specific object of the present invention is to provide a board member with a thin-film structure capacitor which is appropriate for a semiconductor bare chip mounted by flip-chip bonding.

The above-mentioned object of the present invention is achieved by a board member which is bonded to a back surface of a semiconductor bare chip, the semiconductor bare chip mounted on a circuit board by flip-chip bonding, the semiconductor bare chip having a power supply terminal and a grounding terminal on the back surface thereof, the board member comprising: a board; and a thin-film structure capacitor which is formed on a surface of the board, the thin-film structure capacitor having terminals, on a surface of the capacitor, which correspond to the power supply terminal and the grounding terminal of the semiconductor bare chip, wherein the board member is arranged so that the terminals of the thin-film structure capacitor are electrically connected to the power supply terminal and the grounding terminal of the semiconductor bare chip.

In the board member of the present invention, the side of the board member where the thin-film structure capacitor is provided is bonded to the back surface of the semiconductor bare chip, and the terminals of the thin-film structure capacitor are electrically connected to the power supply terminal and the grounding terminal of the semiconductor bare chip. It is not necessary to perform operation to make the electrical connections between the thin-film structure capacitor and the semiconductor bare chip, and the semiconductor device can be manufactured with good productivity. Moreover, the paths of the electrical connections between the thin-film structure capacitor and the semiconductor bare chip can be extremely short.

Other objects, features and advantages of the present invention will become apparent from the following detailed description when read in conjunction with the accompanying drawings.

DETAILED DESCRIPTION OF PREFERRED EMBODIMENTS

Figure 5:
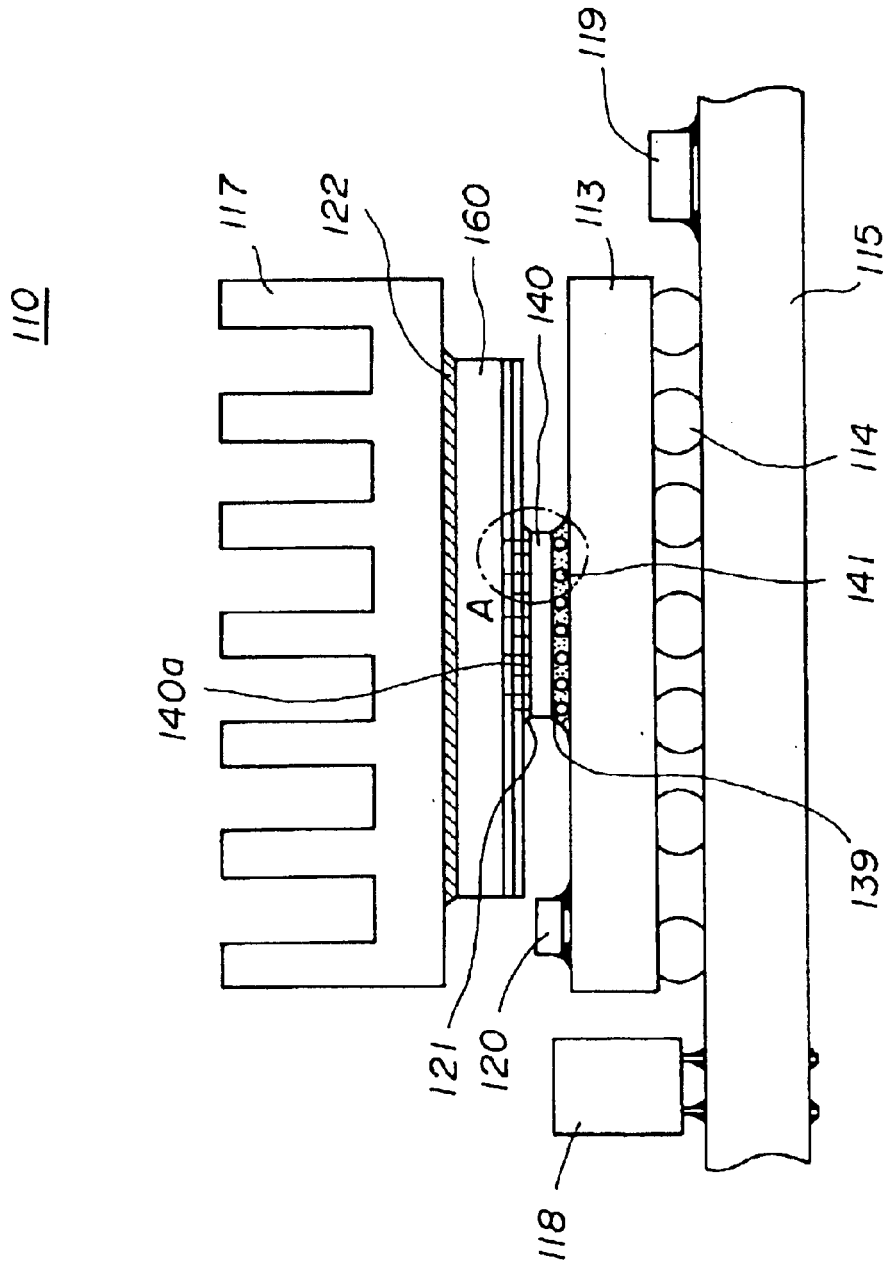
FIG. 5 is a diagram of a first preferred embodiment of the semiconductor device according to the present invention.

FIG. 5 shows a first preferred embodiment of the semiconductor device according to the present invention. An electronic circuit module 110 includes a CMOS type LSI semiconductor bare chip 140 having bumps 141 arranged on the back surface thereof, a circuit board 113 having solder balls 114 arranged on the back surface thereof, a board member 160 with a thin-film structure capacitor, a heat sink 117, an aluminum electrolytic capacitor 118, a tantalum capacitor 119, and a ceramic capacitor 120. The number of capacitors on the semiconductor device is determined by taking into consideration the operating frequency and maxium current of the semiconductor device. In practical applications, some of these capacitors may be omitted.

The CMOS type LSI semiconductor bare chip 140 is mounted on the top surface of the circuit board 113 by flip-chip bonding using the bumps 141. The sealing encapsulant 139 may be used between the semiconductor bare chip 140 and the circuit board 113. The circuit board 113 is mounted on the main board 115 using the solder balls 114. The side of the board member 160 where the thin-film structure capacitor is provided is fixed to the back surface 140a of the semiconductor bare chip 140 by using a bonding material 121 that is insulating and thermally conductive. The heat sink 117 is fixed to the top surface of the board member 160 with the thin-film structure capacitor by using a thermally conductive bonding material 122.

The aluminum electrolytic capacitor 118 and the tantalum capacitor 119 are mounted on the main board 115. The ceramic capacitor 120 is mounted on the circuit board 113.

Figure 7:
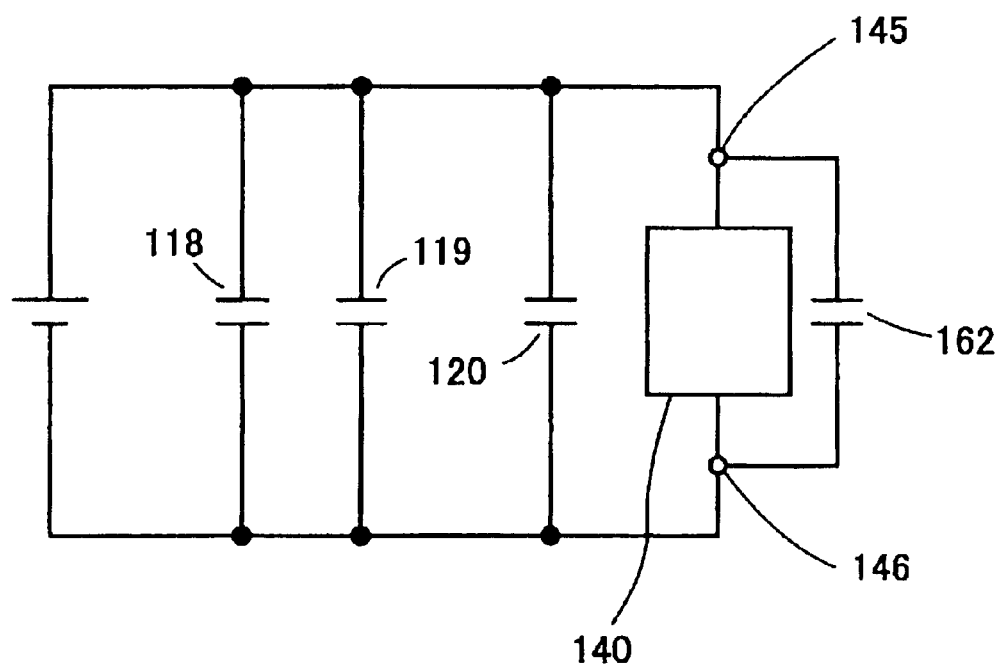
FIG. 7 is a circuit diagram of the circuit related to a CMOS type LSI semiconductor bare chip of the semiconductor device of FIG. 5.

In order to lower the VG impedance Z, the aluminum electrolytic capacitor 118, the tantalum capacitor 119 and the ceramic capacitor 120 are connected between the power supply terminal 145 and the grounding terminal 146 of the semiconductor bare chip 140 as shown in FIG. 7. The floating inductance value of each capacitor determines the frequency band in which the VG impedance Z is kept low. Namely, the floating inductance value of each capacitor determines the frequency band in which the capacitor operates effectively.

The aluminum electrolytic capacitor 118 has a large capacitance, and the floating inductance thereof is large. The tantalum capacitor 119 has an intermediate capacitance, and the floating inductance thereof is intermediate. The ceramic capacitor 120 has a small capacitance, and the floating inductance thereof is small.

Because the floating inductance of the aluminum electrolytic capacitor 118 is larger, it has the low frequency band in which the capacitor operates effectively. The line XI in FIG. 8 indicates the frequency characteristic of the VG impedance Z of the aluminum electrolytic capacitor 118, as being apparent from FIG. 21. Specifically, in the low frequency band, the VG impedance Z of the aluminum electrolytic capacitor 118 is kept low. Since the floating inductance of the tantalum capacitor 119 is intermediate, it has the high frequency band in which the capacitor operates effectively. The line XII in FIG. 8 indicates the frequency characteristic of the VG impedance Z of the tantalum capacitor 119. For example, in the intermediate frequency band on the order of about several MHz, the VG impedance Z of the tantalum capacitor 119 is made low.

Since the floating inductance of the tantalum capacitor 119 is intermediate, it has the high frequency band in which the capacitor operates effectively. The line XII in FIG. 8 indicates the frequency characteristic of the VG impedance Z of the tantalum capacitor 119. For example, in the intermediate frequency band on the order of about several MHz, the VG impedance Z of the tantalum capacitor 119 is made low.

Because the floating inductance of the ceramic capacitor 120 is small, it has the higher frequency band in which the capacitor operates effectively. The line XIII in FIG. 8 indicates the frequency characteristic of the VG impedance Z of the ceramic capacitor 120. For example, in the high frequency band on the order of several 10 MHz through 100 MHz, the VG impedance Z of the ceramic capacitor 120 is made low.

Moreover, the semiconductor bare chip 140 is provided with a capacitor which is internally formed with the thin film of the semiconductor bare chip 140. Because the built-in capacitor of the semiconductor bare chip 140 has a very small floating inductance, the frequency band in which the capacitor works effectively is still higher. The line XIV in FIG. 8 indicates the frequency characteristic of the VG impedance Z of the built-in capacitor of the semiconductor bare chip 140. For example, in the high frequency band higher than the order of several GHz, the VG impedance Z of the built-in capacitor is made low.

Figure 1:
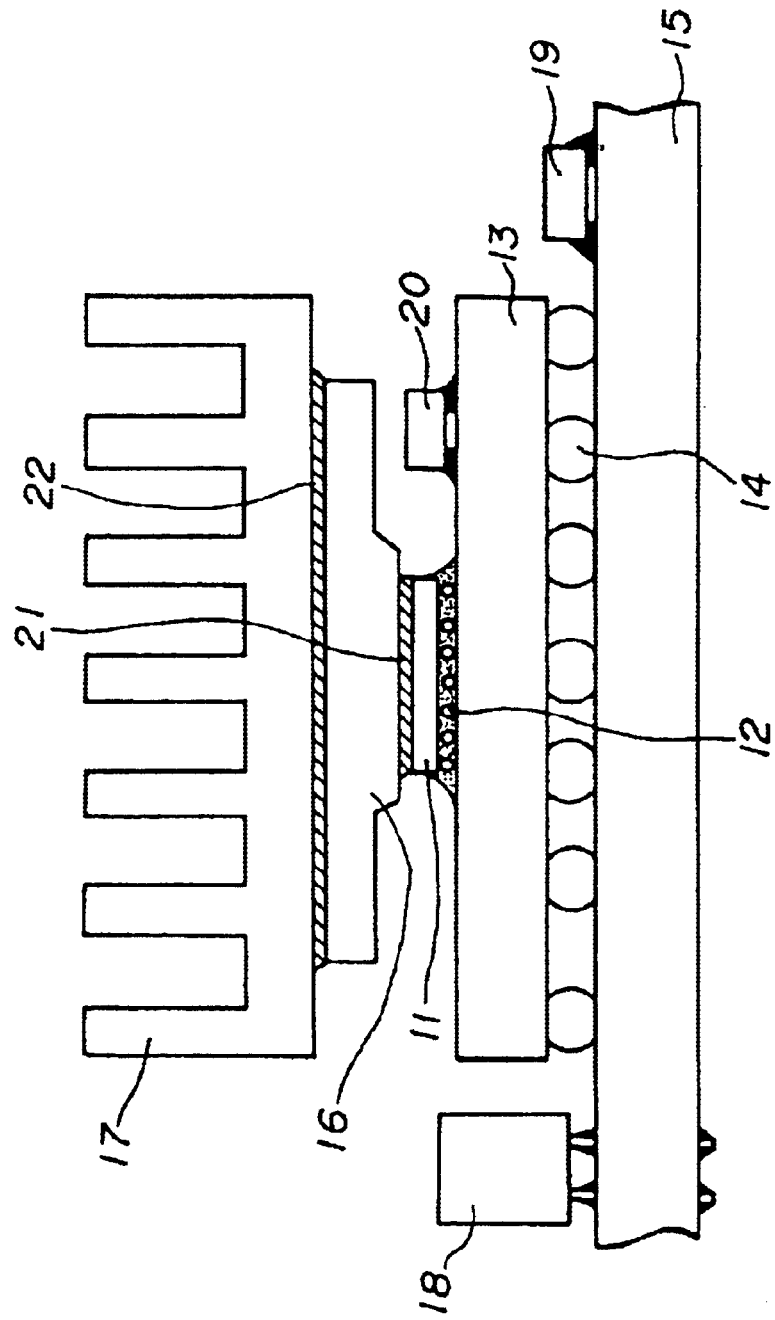
FIG. 1 is a diagram showing the configuration of a conventional semiconductor device.
Figure 2:
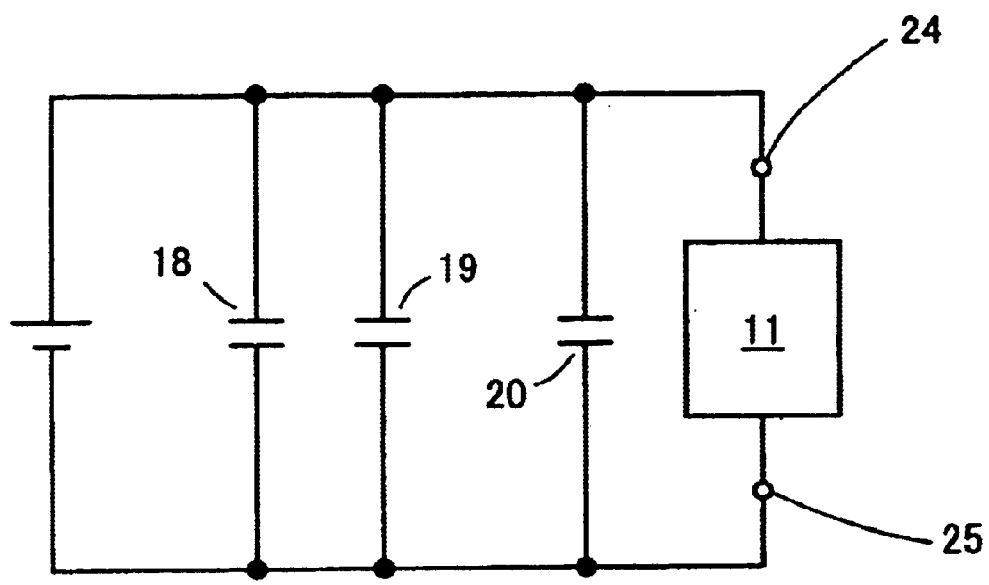
FIG. 2 is a circuit diagram of the circuit related to a CMOS type LSI semiconductor bare chip of the semiconductor device of FIG. 1.
Figure 3:
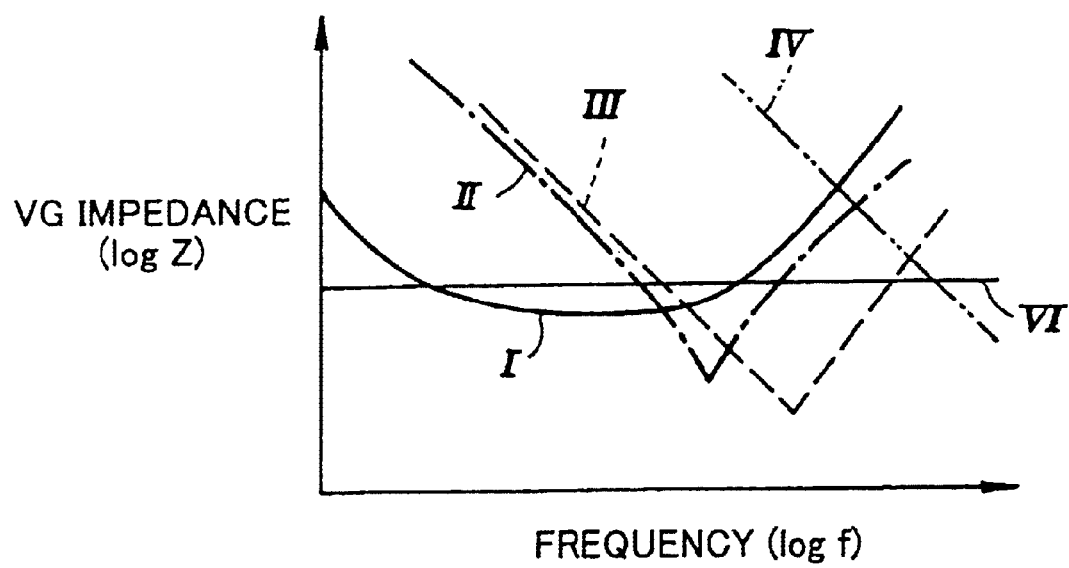
FIG. 3 is a diagram for explaining the frequency characteristic of the VG impedance of each of capacitors contained in the circuit of FIG. 2.

The above-described configuration of the semiconductor device of the present embodiment is essentially the same as that of the conventional semiconductor device 10 in FIG. 1.

Figure 6:
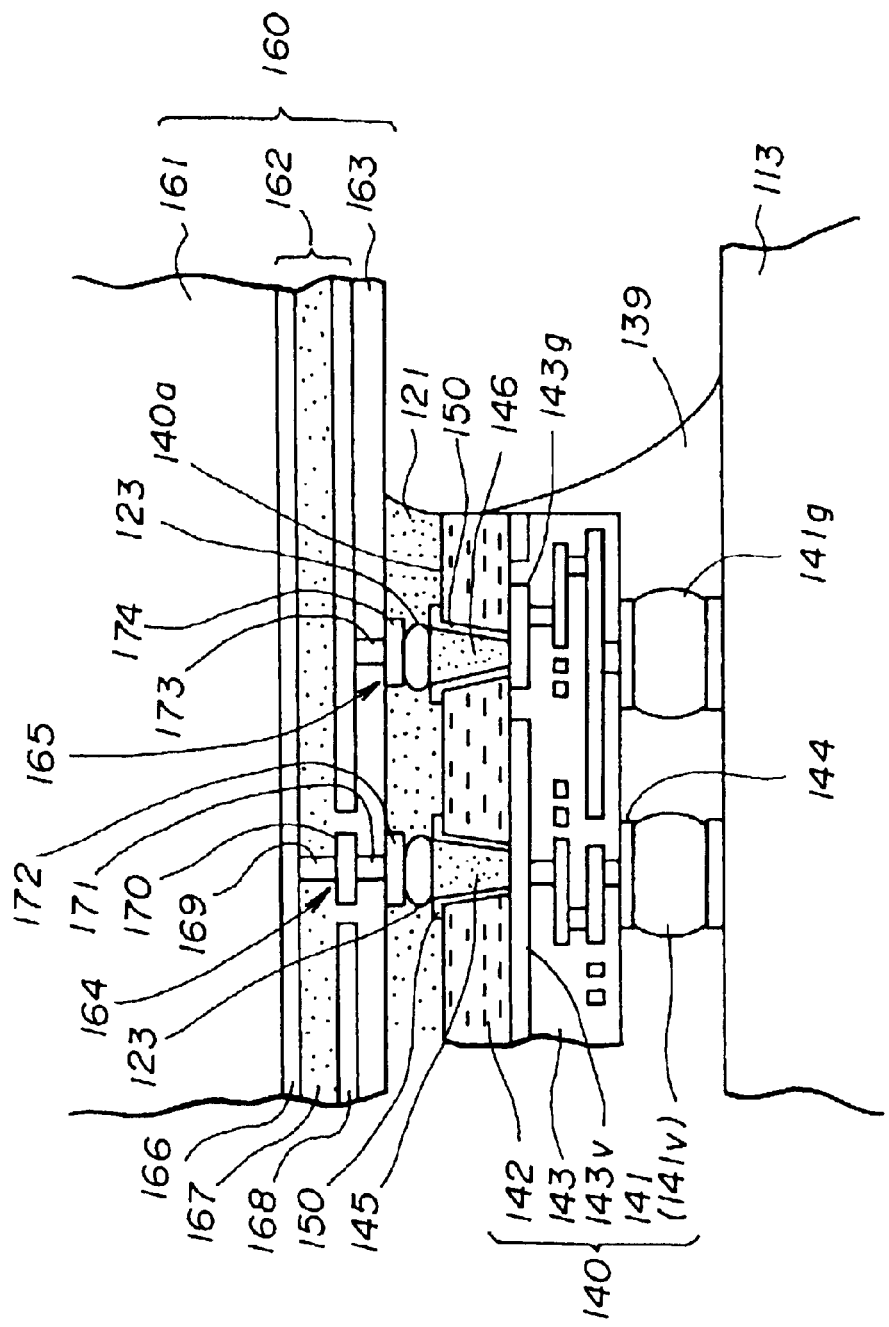
FIG. 6 is an enlarged view of the portion of the semiconductor device indicated by the circle A in FIG. 5.

Next, a description will be given of the semiconductor bare chip 140. FIG. 6 shows the detailed configuration of the portion of the semiconductor device indicated by the circle A in FIG. 5. The semiconductor bare chip 140 has the configuration shown in FIG. 6. The semiconductor bare chip 140 includes a thin silicon chip board 142 which is ground and made thin, a CMOS type LSI circuit structure part 143 which is formed on the back surface of the silicon chip board 142, the bumps 141 which are arranged on the electrode pads 144 of the back surface of the CMOS type LSI circuit 142, a power supply terminal 145 which is formed into a via hole, and a grounding terminal 146 which is formed into a via hole.

The via-hole structure power supply terminal 145 is formed so that it penetrates the thin silicon chip board 142 and is electrically connected to a power supply pattern 143$v$ of the CMOS type LSI circuit structure part 143. The via-hole structure grounding terminal 146 is formed so that it penetrates the thin silicon chip board 142 and is electrically connected to a grounding layer 143$g$ of the CMOS type LSI circuit structure part 143.

The semiconductor bare chip 140 of this embodiment is manufactured as shown in FIG. 10A through FIG. 10F.

Figure 10A:
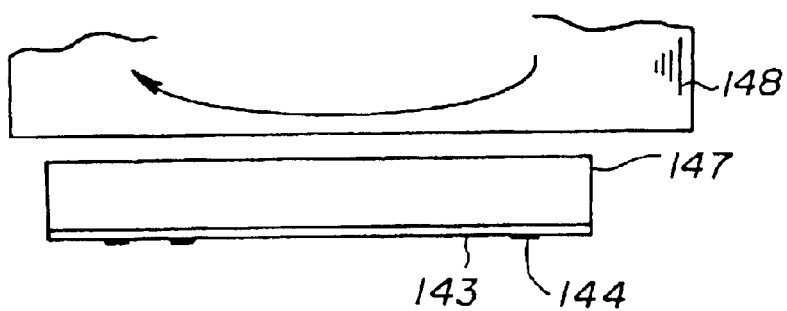
FIG. 10A through FIG. 10F are diagrams for explaining the manufacturing process of the CMOS type LSI semiconductor bare chip.
Figure 10B:
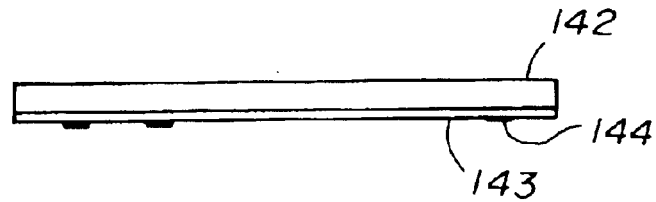
Figure 10C:
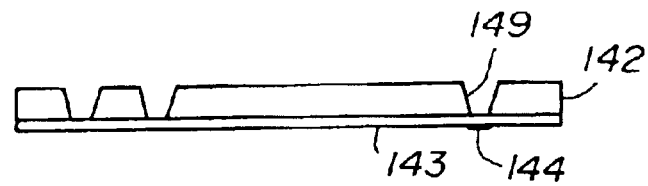
Figure 10D:
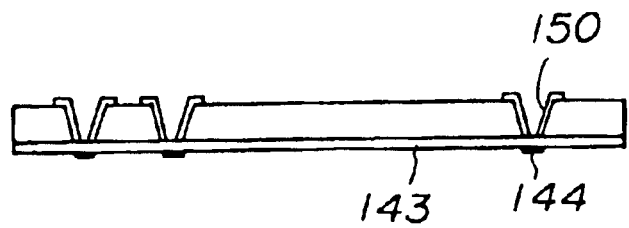
Figure 10E:
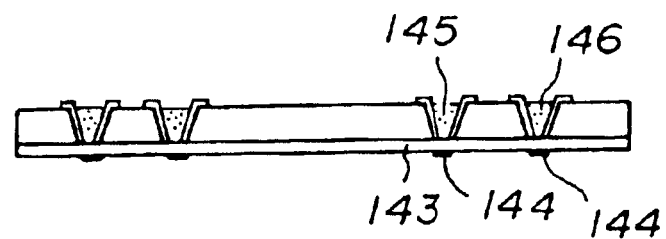
Figure 10F:
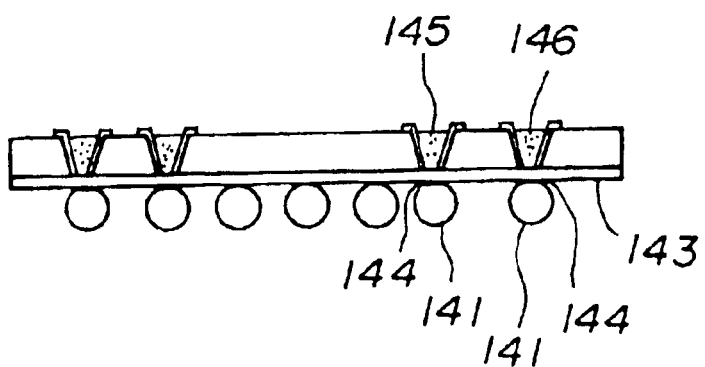

First, as shown in FIG. 10A, the silicon chip board 147 in which the CMOS type LSI circuit structure part 143 is formed, in the wafer process, on the back surface of the silicon chip board 147 is ground by the grinding wheel 148, in the wafer state or after the cutting, so that the silicon chip board 147 is made thin. As shown in FIG. 10B, the silicon chip board 147 is formed into a thin silicon chip board 142. Next, as shown in FIG. 10C, the top surface of the thin silicon chip board 142 is subjected to etching, and holes 149 that reach the back surface of the thin silicon chip board 142 are formed. Next, as shown in FIG. 10D, the insulating film 150 of $SiO_2$ or the like is formed in the inner peripheral surface of each hole 149. Next, as shown in FIG. 10E, by performing vacuum deposition with a metal such as aluminum, the surface of the insulating film 150 on the inner peripheral surface of each hole 149 is covered with the metal such as aluminum. The respective holes 149 are filled by the metal, and the via-hole structure power supply terminal 145 and the via-hole structure grounding terminal 146 are formed. Finally, the bumps 141 are formed on the respective electrode pads 144 of the CMOS type LSI circuit structure part 143. The position of the via-hole structure power supply terminal 145 corresponds to the position of the bump 141$v$ for the power supply. The position of the via-hole structure grounding terminal 146 corresponds to the position of the bump 141$g$ for the grounding.

Next, a description will be given of the board member 160 with the thin-film structure capacitor. The board member 160 has the configuration shown in FIG. 6. The board member 160 with the thin-film structure capacitor includes a board 161 which is made of a ceramic material and insulating and thermally conductive, a thin-film structure capacitor 162 which is provided on the back surface of the board 161, a protective insulation film 163 which is provided on the back surface of the capacitor 162, and terminals 164 and 165.

The thin-film structure capacitor 162 includes a conducting layer 166 which is provided on the back surface of the board 161, an insulating layer 167 which is provided on the back surface of the conducting layer 166, and a conducting layer 168 which is provided on the back surface of the insulating layer 167. The insulating layer 167 is interposed between the conducting layer 166 and the conducting layer 168, and the conducting layers 166 and 168 are opposed to each other via the insulating layer 167. The terminals 164 and 165 are arranged so that the positions of the terminals 164 and 165 correspond to the positions of the via hole 145 for the power supply terminal and the via hole 146 for the grounding terminal, respectively.

The terminal 164 includes a via 171 which rests on the conducting layer 166 and penetrates the insulating layer 167, a connection pad 170 which is provided at the end of the via 169, a via 171 which rests on the connection pad 170 and penetrates the protective insulating film 163, and a connection pad 172 which is provided at the end of the via 171 and exposed on the surface of the protective insulting film 163.

The terminal 165 includes a via 173 which rests on the conducting layer 168 and penetrates the protective insulating film 163, and a connection pad 174 which is provided at the end of the via 173 and exposed on the surface of the protective insulting film 163.

A description of the manufacturing process of the thin-film structure capacitor 162 will be provided later.

The above-described board member 160 with the thin-film structure capacitor is bonded to the top surface of the CMOS type LSI semiconductor bare chip 140 by using the bonding material 121. The electrical connection between the connection pad 172 at the end of the terminal 164 and the via-hole structure power supply terminal 145, and the electrical connection between the connection pad 177 at the end of the terminal 165 and the via-hole structure grounding terminal 146 are respectively made by using the conductive adhesive 123.

As shown in FIG. 7, the thin-film structure capacitor 162 is connected between the power supply terminal 145 and the grounding terminal 146 of the semiconductor bare chip 40. Actually, a plurality of via-hole structure power supply terminals 145, a plurality of via-hole structure grounding terminals 146, a plurality of terminals 164 and a plurality of terminals 165 are provided, and there are many electrical connections between the thin-film structure capacitor 162 and the semiconductor bare chip 140.

In the present embodiment, the thin-film structure capacitor 162 has a large capacitance that is above 1 $\mu F$. Moreover, the terminal 164 and the terminal 165 are directly connected to the via-hole structure power supply terminal 145 and the via-hole structure grounding terminal 146, respectively. The electrical connections are substantially in the direction of the thickness, and the paths of the electrical connections are extremely short in length. Therefore, the inductance of the thin-film structure capacitor 162 is small. In addition, there are many connecting locations in the capacitor 162, and the inductance thereof is still smaller.

Figure 8:
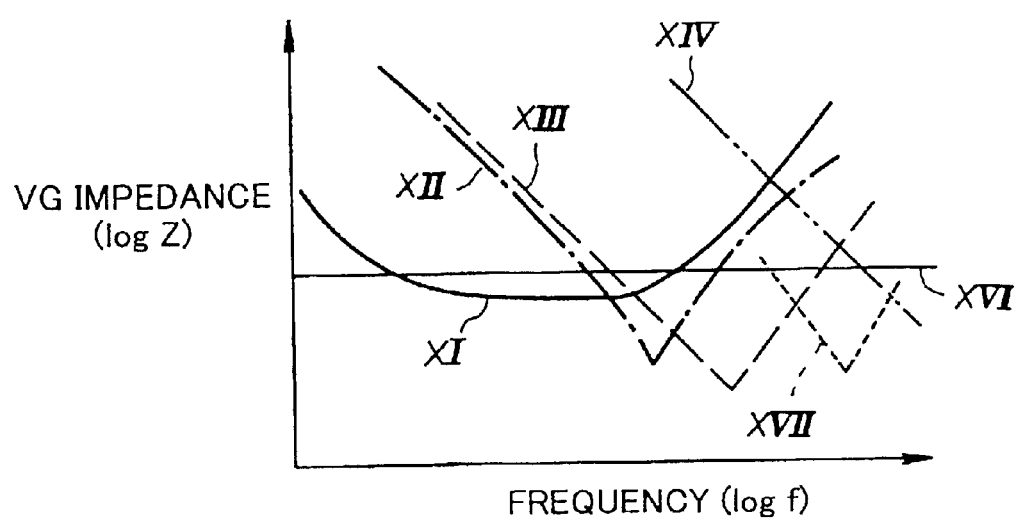
FIG. 8 is a diagram for explaining the frequency characteristic of the VG impedance of each of capacitors contained in the circuit of FIG. 7.
Figure 21:
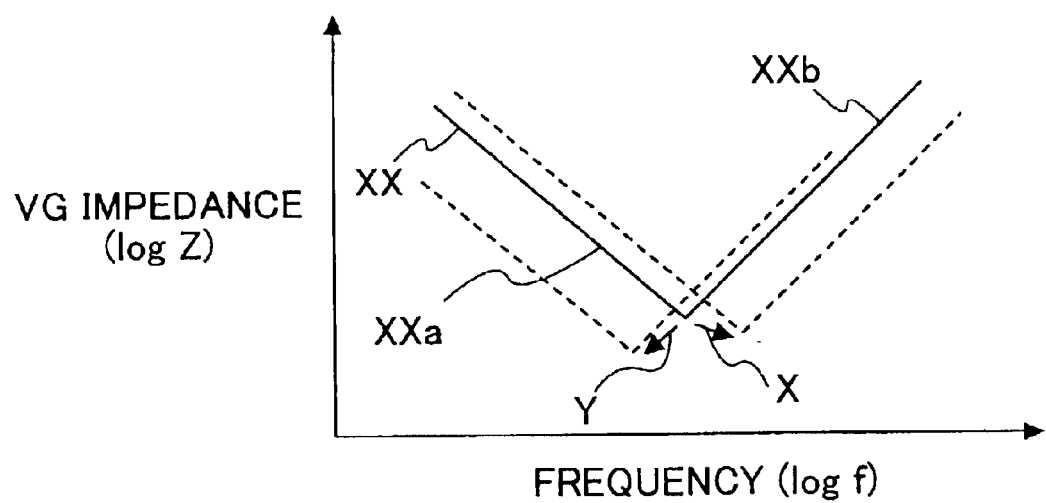
FIG. 21 is a diagram for explaining the frequency characteristic of the VG impedance of a capacitor.

The line XVII in FIG. 8 indicates the frequency characteristic of the VG impedance Z of the thin-film structure capacitor 162, as being apparent from FIG. 21. In the high frequency band higher than 100 MHz, which is, for example, the 1–3 GHz frequency band, the VG impedance Z of the capacitor 162 is kept low. Such frequency band corresponds to the frequency band 127 in FIG. 4 where the improvement of the conventional semiconductor device is required.

The frequency characteristic of the VG impedance Z of the above-described semiconductor device 110 can be obtained by the superimposition of the frequency characteristic indicated by the line XVII and the frequency characteristics indicated by the lines XI, XII, XIII and XIV. That is, the frequency characteristic of the VG impedance Z of the semiconductor device 110 is obtained as indicated by the line XV in FIG. 9.

Figure 4:
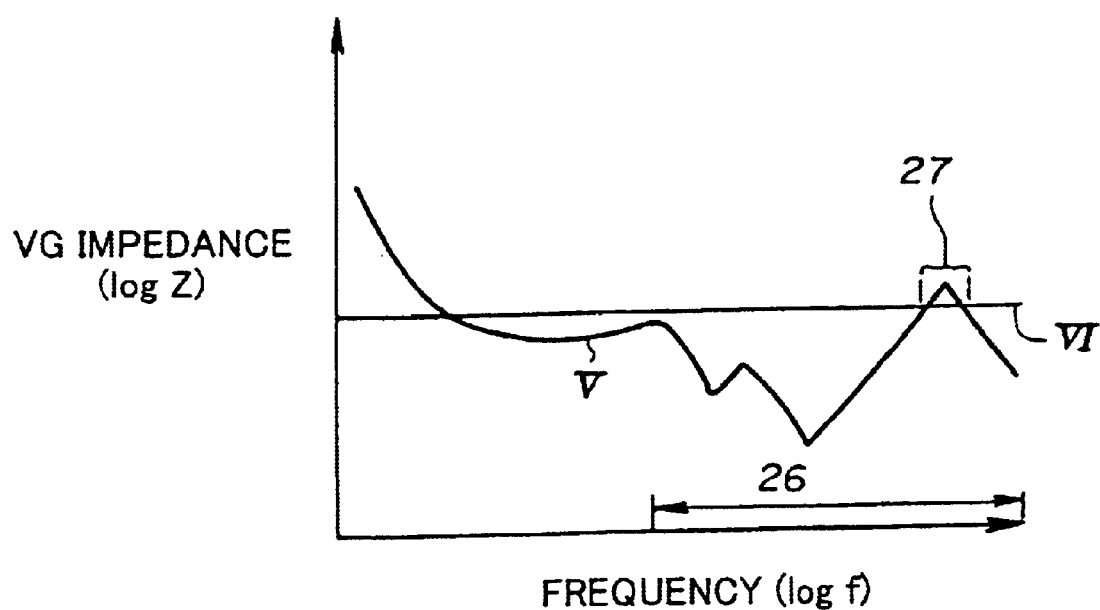
FIG. 4 is a diagram for explaining the frequency characteristic superimposing the frequency characteristics of the VG impedances of the respective capacitors of FIG. 3.
Figure 9:
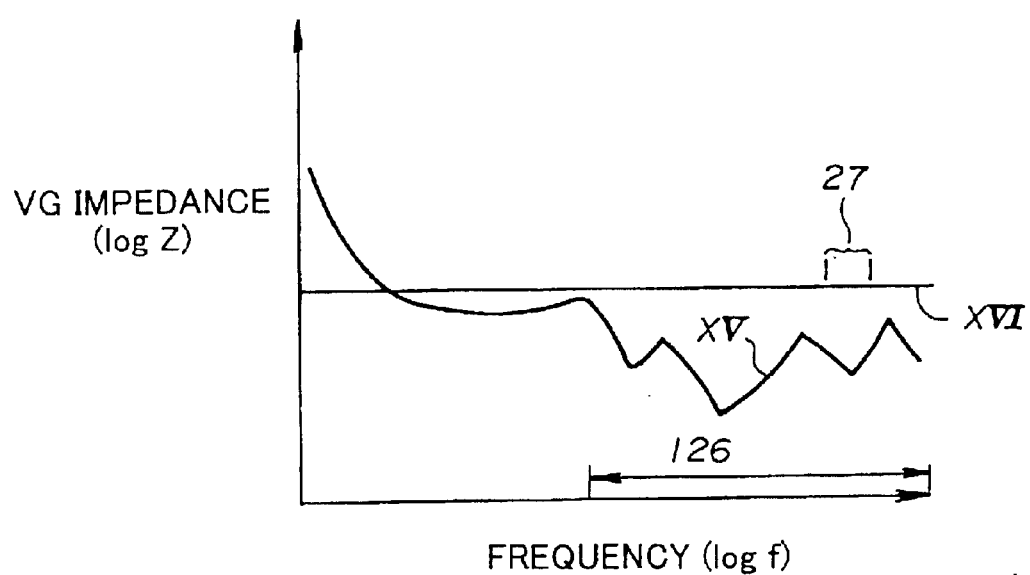
FIG. 9 is a diagram for explaining the frequency characteristic superimposing the frequency characteristics of the VG impedances of the respective capacitors of FIG. 7.

As shown by the line XV in FIG. 9, the frequency characteristic indicated by the line XVII is combined together, and, therefore, the VG impedance Z of the semiconductor device 110 in the high frequency band 27 where the improvement of the conventional semiconductor device is required as in FIG. 4, is kept low. In the whole use frequency region 126, the VG impedance Z of the semiconductor device 110 is kept as being lower than the permissible AC noise voltage indicated by the line XVI.

Accordingly, the semiconductor device 110 operates with high reliability at a low operating power supply voltage which is, for example, 1.5V or 1V, when compared with the conventional semiconductor device 10 in FIG. 1.

Moreover, the paths of the electrical connections between the thin-film structure capacitor 162 and the semiconductor bare chip 140 are short, and the paths of the electrical connections are not easily affected by the AC noise voltage in the low frequency band or the AC noise voltage transferred from another LSI. This also contributes to high reliability of the operation of the semiconductor device 110.

When the CMOS type LSI is configured in the structure wherein the semiconductor bare chip is packaged by using a synthetic resin and the lead terminals project from the package, the inductance of the lead terminals is large, and the VG impedance is raised at a certain frequency in the use frequency band 126. For this reason, it is difficult for the CMOS type LSI to meet the above-described demand. To eliminate the problem, according to the present embodiment, the CMOS type LSI can be configured in the structure that can make the inductance low. In other words, it is possible that the CMOS type LSI be configured in the structure that can have the semiconductor bare chip mounted by flip-chip bonding. Moreover, in the flip-chip bonding, the bumps are arranged on the back surface of the semiconductor bare chip, and the number of the bumps in the semiconductor bare chip can easily be increased. The flip-chip bonding can also contribute to high integration of the CMOS type LSI.

Moreover, in the semiconductor device 110, the heat generated in the semiconductor bare chip 140 is transferred to the board member 160 with the thin-film structure capacitor, and the heat is spread in the board 161. The heat is further transferred to the heat sink 117, and the heat is radiated in air from the surfaces of the heat sink 117. Therefore, the semiconductor bare chip 140 is cooled efficiently.

Next, a description will be given of the manufacturing process of the thin-film structure capacitor 162 with reference to FIG. 11A through FIG. 11H and FIG. 12A through FIG. 12G.

Figure 11A:
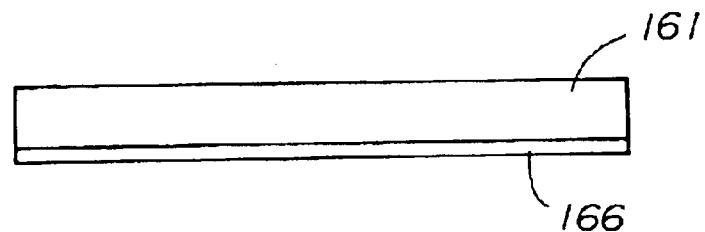
FIG. 11A through FIG. 11H are diagrams for explaining the first half of the manufacturing process of a board member with a thin-film structure capacitor.
Figure 11B:
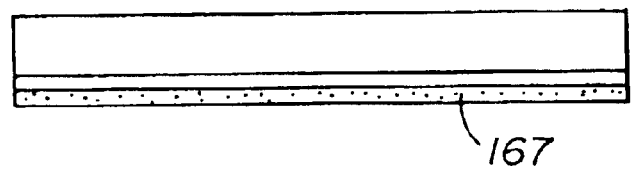

First, as shown in FIG. 11A, in order to increase the adhesion property of the back surface of the board 161 which is made of a ceramic material, sputtering of Ti is performed to the back surface of the board 161. After this, plating of Cu is performed, and the conducting layer 166 is formed thereon. Next, as shown in FIG. 11B, the surface of the conducting layer 166 is subjected to the coating of an insulating material having a high dielectric constant which is performed at different levels and several times if needed. Baking is performed after the coating, so that the insulating layer 167 is formed.

Figure 11C:
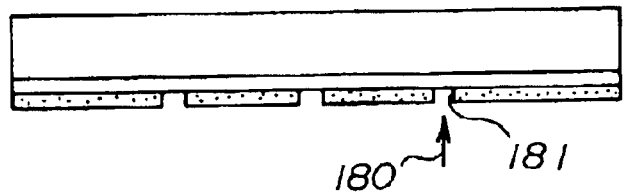
Figure 11D:
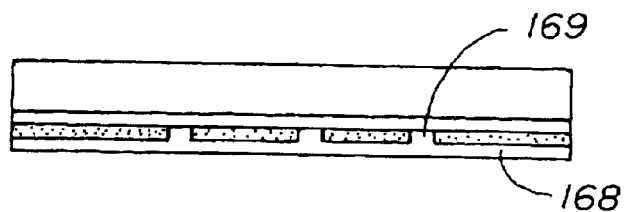

Next, as shown in FIG. 11C, a laser beam 180 is irradiated thereto and a hole 181 is formed in the insulating layer 167. Next, as shown in FIG. 11D, carbide and residual substances on the surface are removed, and the plating of Cu is performed. This allows the conducting layer 168 to be formed on the surface of the insulating layer 167. The insulating layer 167 is interposed between the conducting layer 166 and the conducting layer 168, and the basic structure of the thin-film structure capacitor 162 is formed. Moreover, the Cu plated part which fills the hole 181 forms the via 169.

Figure 11E:
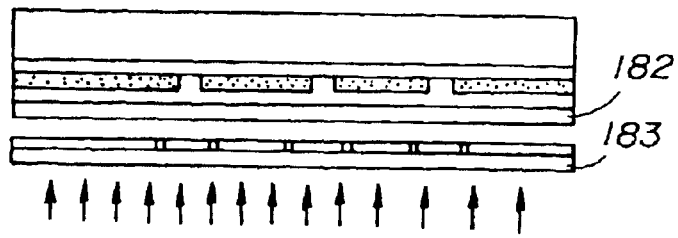
Figure 11F:
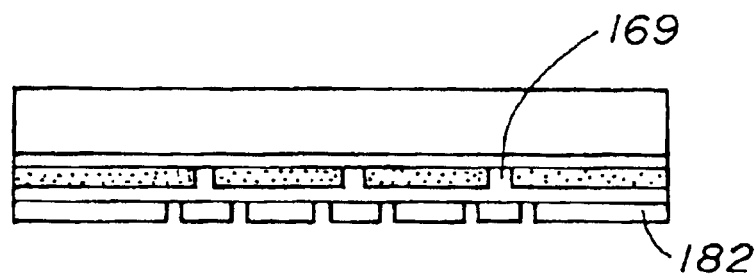
Figure 11G:
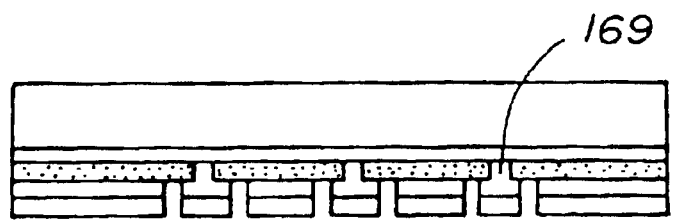
Figure 11H:
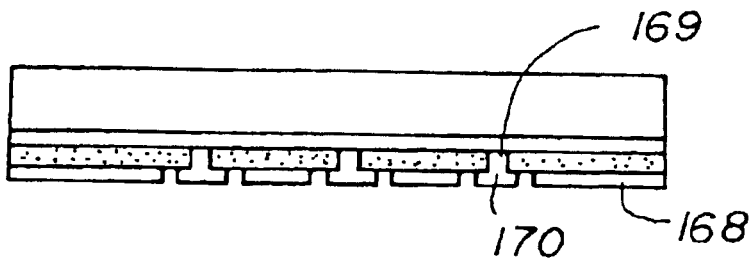

Next, as shown in FIG. 11E, the application of the resist 182 is performed and it is exposed to light using the mask 183 which has a pattern corresponding to the via 169. Next, as shown in FIG. 11F, the developing is performed. Next, as shown in FIG. 11G, the etching is performed, and the portion which surrounds the via 169 in the conducting layer 168 is removed. Next, as shown in FIG. 1H, the resist 182 is eliminated. This allows the connection pad 170 to be formed after this.

Figure 12A:
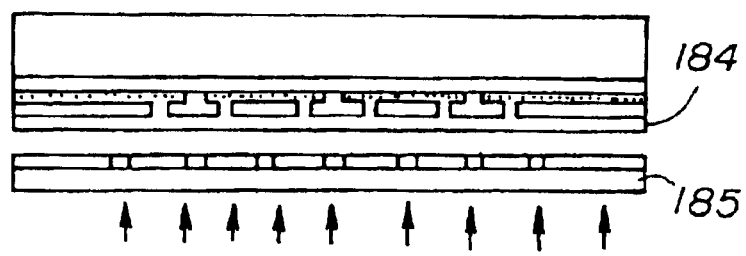
FIG. 12A through FIG. 12G are diagrams for explaining the second half of the manufacturing process of the board member with the thin-film structure capacitor, following the process of FIG. 11H.
Figure 12B:
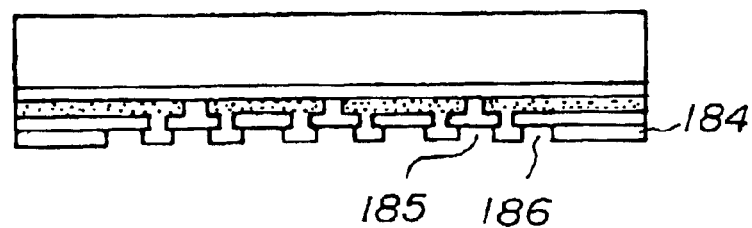

Next, as shown in FIG. 12A, the application of photosensitive epoxy or photosensitive polyimid 184 is performed to the surface, and it is exposed to light using the mask 185 having a predetermined pattern. Next, as shown in FIG. 12B, the developing is performed so that a hole 185 is formed at one portion of the connection pad 170 and a hole 186 is formed in another portion of the connection pad 170.

Figure 12C:
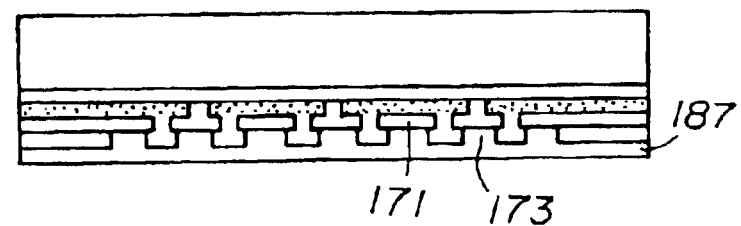

Next, the plating of Cu is performed as shown in FIG. 12C. This allows the Cu film 187 to be formed on the surface. The Cu film which fills the hole 185 forms the via 171, and the Cu film which fills the hole 186 forms the via 173.

Figure 12D:
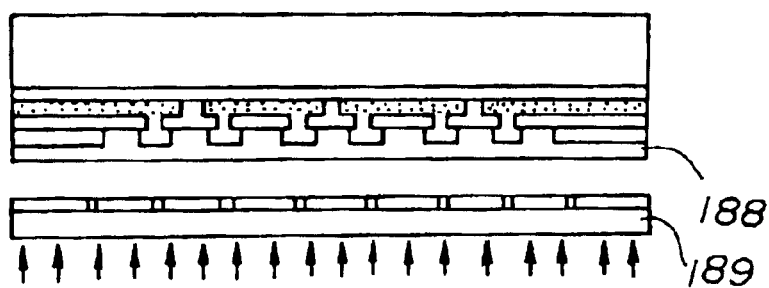

Next, as shown in FIG. 12D, the application of the resist 188 is performed, and it is exposed to light using the mask 189 having a pattern that corresponds to the via 171 and the via 173.

Figure 12E:
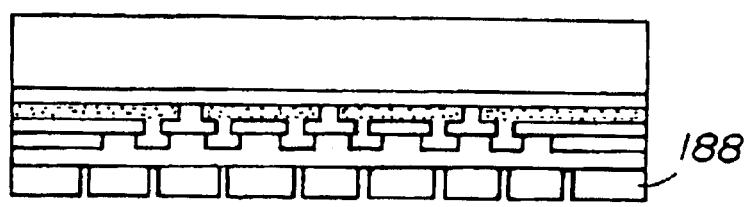
Figure 12F:
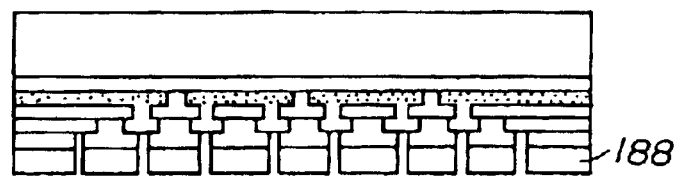
Figure 12G:
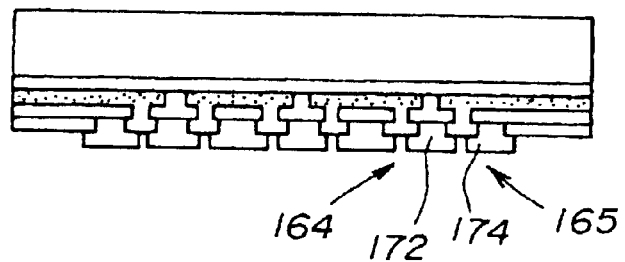

Next, the developing is performed as shown in FIG. 12E. Next, as shown in FIG. 12F, the etching is performed so that the portion which surrounds the via 171 and the via 173 in the conducting layer 188 is removed. Next, as shown in FIG. 12G, the resist 188 is eliminated. The connection pads 172 and 174 are formed after this, and the terminals 164 and 165 are produced. By the above manufacturing process, the thin-film structure capacitor 162 is produced and the board member 160 with the thin-film structure capacitor is produced.

As described above, the thin-film structure capacitor 162 is formed on the board 161, and the circuit board 113, the board member 160 and the capacitor 162 are produced separately from one another. The formation of the thin-film structure capacitor 162 does not affect the yield of the manufacture of the circuit board 113 and the board member 160. Therefore, the semiconductor device 110 of the present embodiment is manufactured with good productivity.

Figure 13:
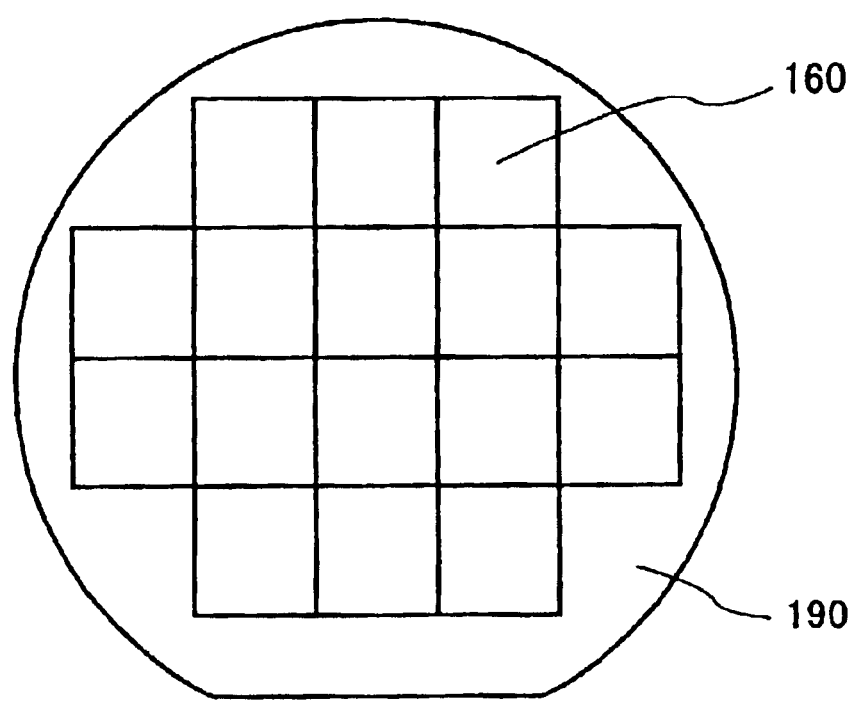
FIG. 13 is a diagram of the wafer from which the board member with the thin-film structure capacitor is cut away.

Practically, as shown in FIG. 13, a plurality of board members 160 with thin-film structure capacitors are arranged on the surface of the wafer 190 of the mother board material, and the board members 160 with thin film capacitors in the wafer 190 are formed at the same time. After this, each board member 160 is produced by cutting the wafer into pieces.

Next, a description will be given of a second preferred embodiment of the semiconductor device according to the present invention with reference to FIG. 14.

Figure 14:
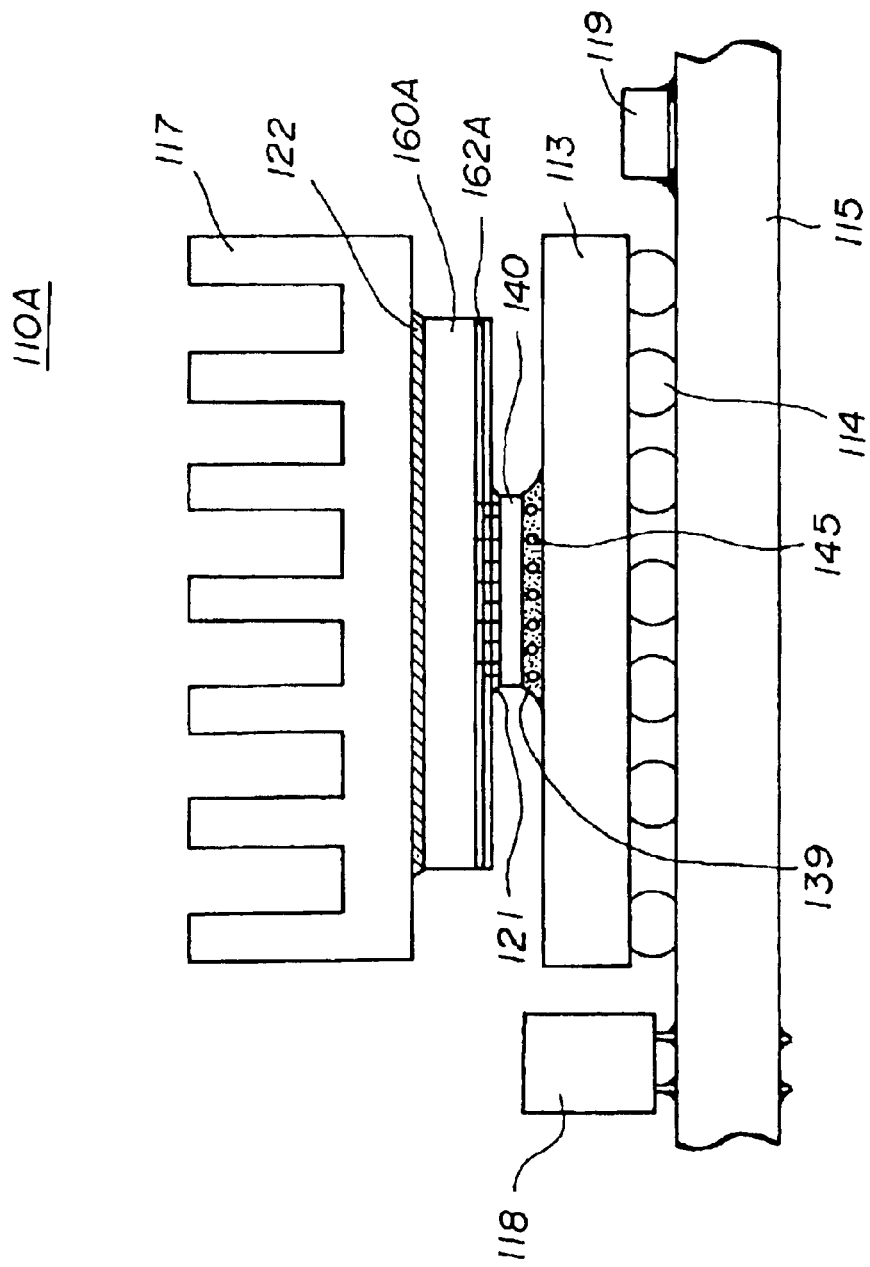
FIG. 14 is a diagram of a second preferred embodiment of the semiconductor device according to the present invention.
Figure 15:
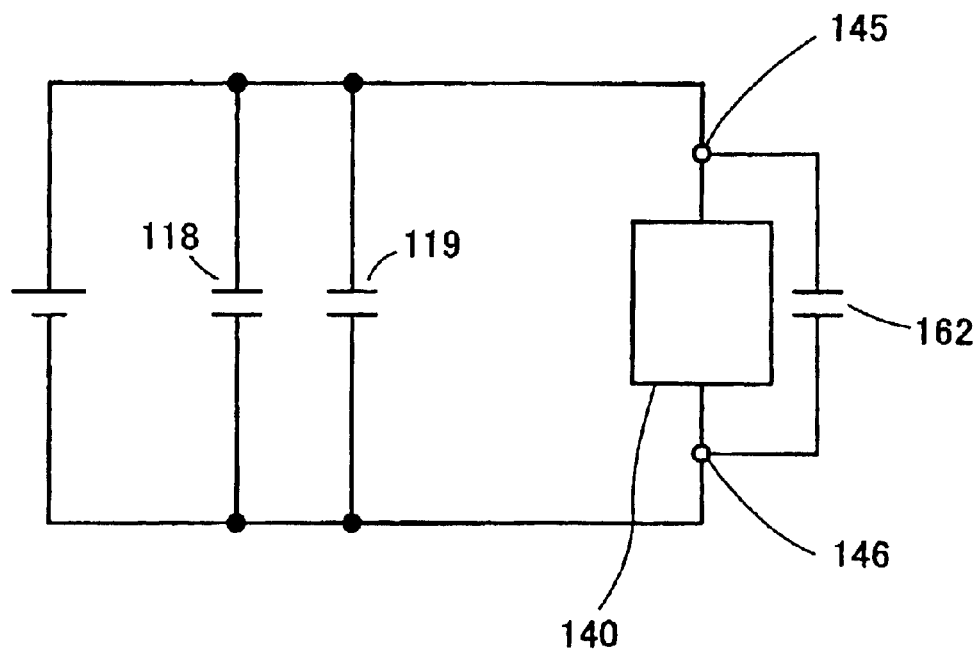
FIG. 15 is a circuit diagram of the circuit related to a CMOS type LSI semiconductor bare chip of the semiconductor device of FIG. 14.

A semiconductor device 110A, shown in FIG. 14 and FIG. 15, is different from the semiconductor device 110 shown in FIG. 5 and FIG. 7 in that the ceramic capacitor 120 is not provided.

Figure 16:
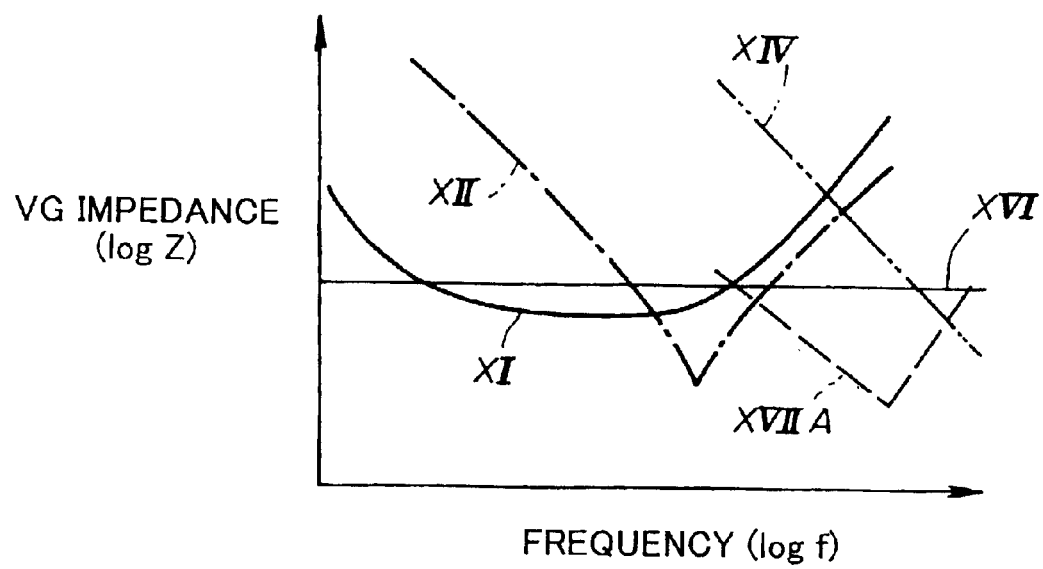
FIG. 16 is a diagram for explaining the frequency characteristic of the VG impedance of each of capacitors contained in the circuit of FIG. 14.

The VG impedance Z of a thin-film structure capacitor 162A of the a board member 160A provides a frequency characteristic as indicated by a line XVIIA in FIG. 16. The frequency characteristic of the VG impedance Z of the capacitor 162A and the frequency characteristic indicated by the line XII in FIG. 16 overlap each other. Because the VG impedance Z of the thin-film structure capacitor 162A provides such frequency characteristic, the ceramic capacitor 120 is omitted in this embodiment.

The frequency characteristic of the VG impedance Z of the semiconductor device 110A can be obtained by the superimposition of the frequency characteristic indicated by the line XVIIA and the frequency characteristics indicated by the lines XI, XII and XIV. That is, the frequency characteristic of the VG impedance Z of the semiconductor device 110A is obtained as indicated by the line XVA in FIG. 17.

Figure 17:
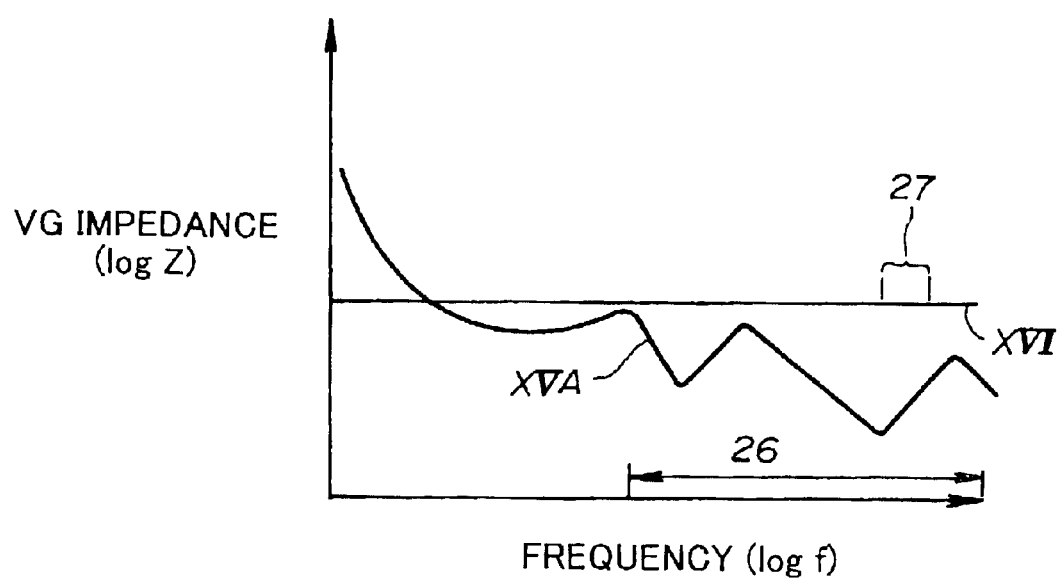
FIG. 17 is a diagram for explaining the frequency characteristic superimposing the frequency characteristics of the VG impedances of the respective capacitors of FIG. 16.

As shown by the line XVA in FIG. 17, the frequency characteristic indicated by the line XVIIA is combined together, and, therefore, the VG impedance Z of the semiconductor device 110A in the high frequency band 27 where the improvement of the conventional semiconductor device is required as in FIG. 4, is kept low. In the whole use frequency region 26, the VG impedance Z of the semiconductor device 110A is kept as being lower than the permissible AC noise voltage indicated by the line XVI in FIG. 17.

Accordingly, the semiconductor device 110A operates with high reliability at a low operating power supply voltage which is, for example, 1.5V or 1V, when compared with the conventional semiconductor device 10 in FIG. 1.

Figure 18:
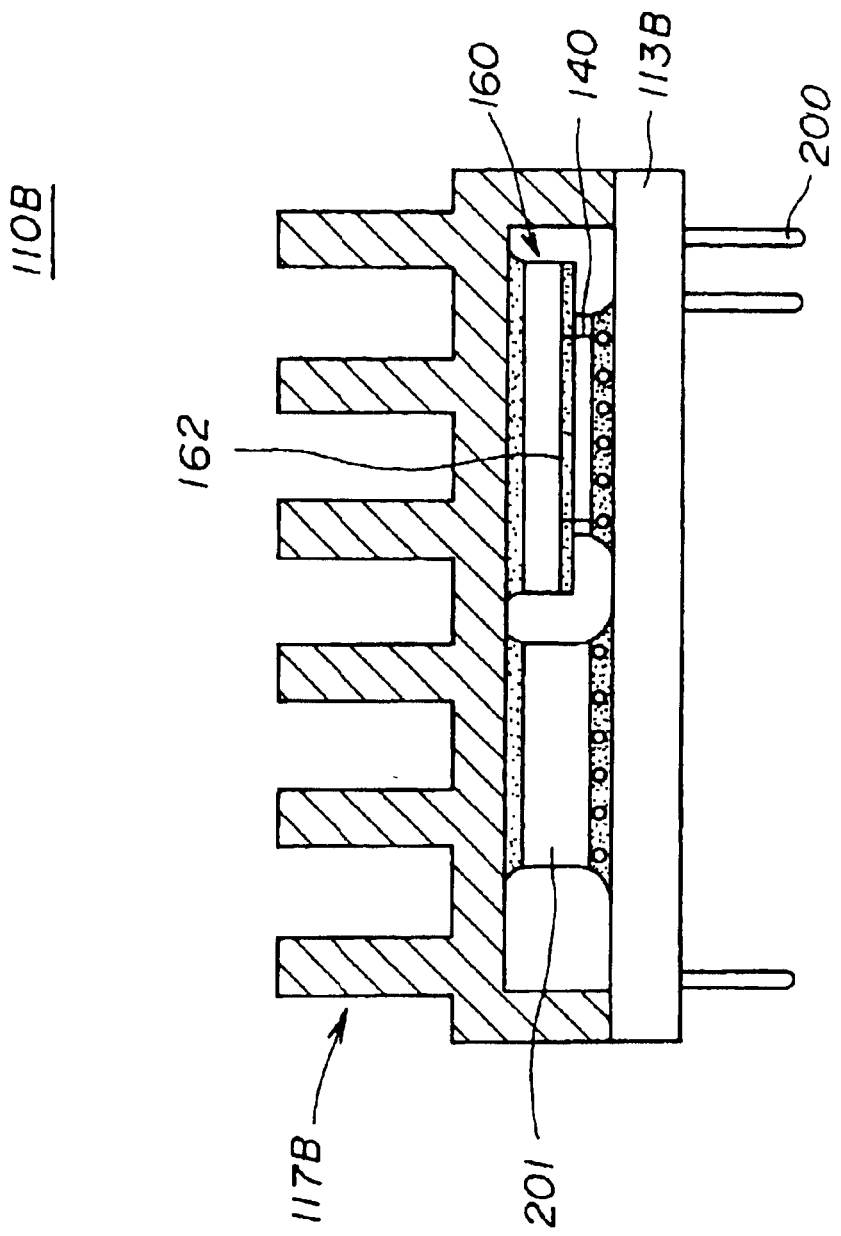
FIG. 18 is a diagram of a third preferred embodiment of the semiconductor device according to the present invention.

Next, a description will be given of a third preferred embodiment of the semiconductor device according to the present invention with reference to FIG. 18.

A semiconductor device 110B of this embodiment is configured so that a CMOS type LSI semiconductor bare chip 140 and a semiconductor bare chip 201 having a small flowing current are provided. The semiconductor device 110B includes a circuit board 113B which has downward projecting pin terminals 200 arrayed in line on the back surface thereof, a CMOS type LSI semiconductor bare chip 140 which is mounted on the top surface of the circuit board 113B by flip-chip bonding, a board member 160 with a thin-film structure capacitor which is mounted on the semiconductor bare chip 140, a semiconductor bare chip 201 which is mounted, in alignment with the semiconductor bare chip 140, on the top surface of the circuit board 113B by flip-chip bonding, and a heat sink 117B which is fixed to both the top surface of the semiconductor bare chip 201 and the top surface of the board member 160 with the thin-film structure capacitor by a bonding material.

The semiconductor bare chip 201 has the thickness that sums the semiconductor bare chip 140 and the board member 160 with the thin-film structure capacitor. Hence, the heat sink 117B is fixed in common to the top surface of the board member 160 and the top surface of the semiconductor bare chip 201. The end portions of the heat sink 117B are fixed onto the circuit board 113B.

In the present embodiment, the thin-film structure capacitor 162 of the board member 160 is electrically connected to the semiconductor bare chip 140, and the CMOS type LSI circuit structure part of the semiconductor bare chip 140 operates with high reliability, without being influenced of the AC noise voltage at a low operating power supply voltage as in the conventional semiconductor device.

In the present embodiment, the semiconductor bare chip 201 has a small flowing current, and even if the VG impedance Z thereof is high to some extent, the semiconductor bare chip 201 is not easily affected by the AC noise voltage.

Figure 19:
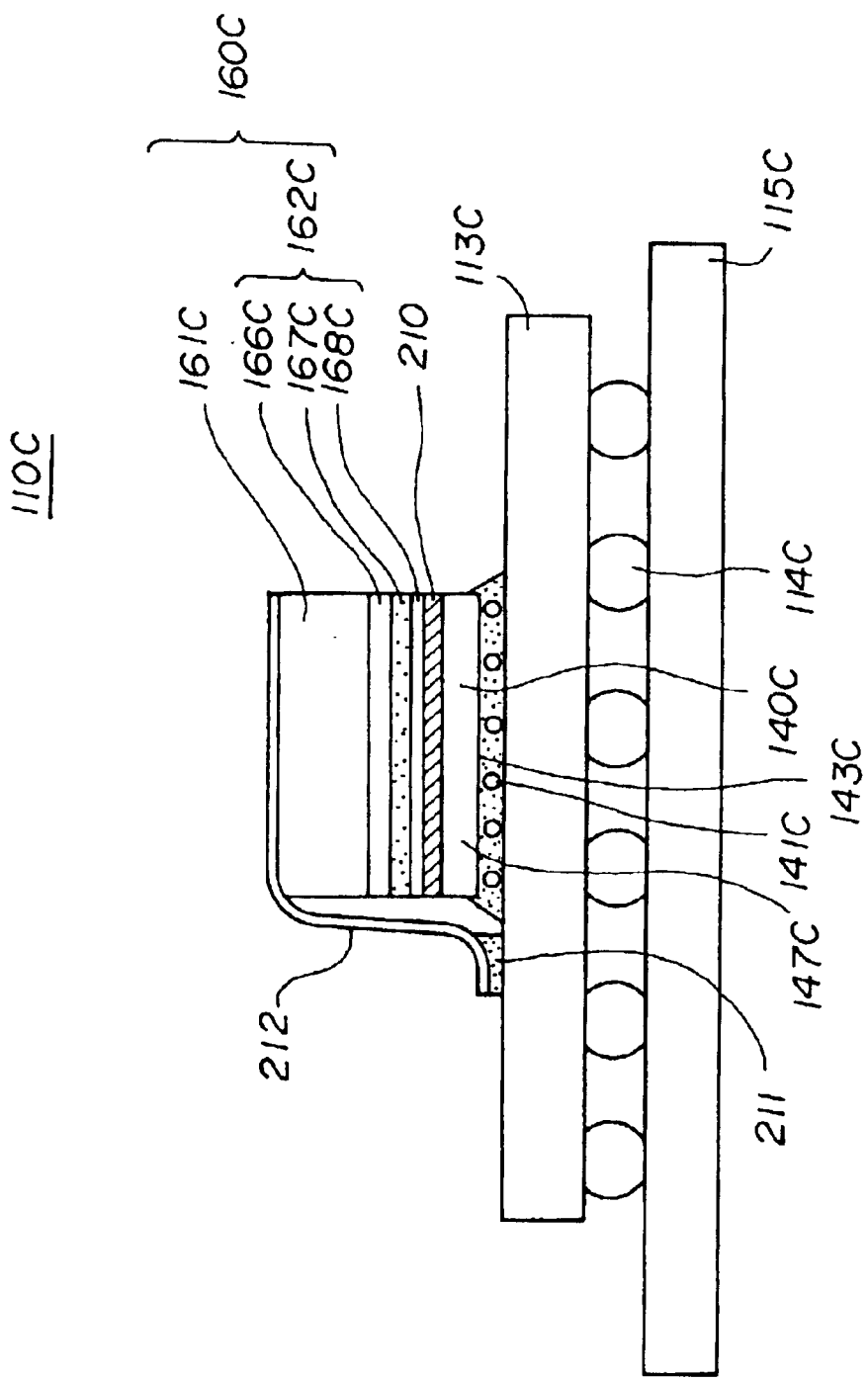
FIG. 19 is a diagram of a fourth preferred embodiment of the semiconductor device according to the present invention.

Next, a description will be given of a fourth preferred embodiment of the semiconductor device according to the present invention with reference to FIG. 19.

A semiconductor device 110C of this embodiment generally includes a circuit board 113C which has solder balls 114C arranged on the back surface thereof, a CMOS type LSI semiconductor bare chip 140C which is mounted on the top surface of the circuit board 113C by flip-chip bonding using bumps 141C on the back surface of the semiconductor bare chip 140C, and a board member 160C which is bonded to the top surface of the semiconductor bare chip 140C.

The CMOS type LSI semiconductor bare chip 140C is provided with a CMOS type LSI circuit structure part 143C which is formed on the back surface of a silicon chip board 147C, and the bumps 141C are arranged on the back surface of the CMOS type LSI circuit structure part 143C. The silicon chip board 147C has a usual thickness, and it is not provided with a via-hole structure terminal.

The semiconductor device 110C is mounted on the main board 115C by using the solder balls 114C which are arranged on the back surface of the circuit board 113C. The board member 160C is provided with the thin-film structure capacitor 162C which is provided on the back surface of the board 161C which has a good electrical conductivity and a good thermal conductivity. The material of the board 161C is, for example, a carbon material in which any of a copper alloy, an aluminum alloy, and another metallic material is impregnated.

The thin-film structure capacitor 162C includes a conducting layer 166C on the back surface of the board 161C, an insulating layer 167C on the conducting layer 166C, and a conducting layer 168C on the insulating layer 167C. The insulating layer 167C is interposed between the conducting layer 166C and the conducting layer 168C, and the conducting layer 166C and the conducting layer 168C are opposed to each other via the insulating layer 167C.

The side of the board member 160 with the thin-film structure capacitor where the conducting layer 168C is provided is bonded to the top surface of the semiconductor bare chip 140C by using the adhesive agent 210 which has an electrical conductivity and a thermal conductivity. The electrical connection between the power supply terminal 211, located on the top surface of the board 161C of the board member 160C, and the top surface of the circuit board 113 is made by using a flexible terminal 212. The electrical connection between the flexible terminal 212 and the power supply terminal 211 is made by using a solder or a conductive adhesive agent.

Therefore, the conducting layer 168C of the thin-film structure capacitor 162C is electrically connected to the grounding layer of the CMOS type LSI circuit structure part 143C through the adhesive agent 210 and the silicon chip board 147C. The conducting layer 166 of the thin-film structure capacitor 162C is electrically connected to the power supply layer of the CMOS type LSI circuit structure part 143C through the board 161C, the flexible terminal 212, the pattern of the circuit board 113C and the bumps 141C. Therefore, similar to the circuit shown in FIG. 7, the thin-film structure capacitor 162C has a small inductance due to the CMOS type LSI semiconductor bare chip 140C, and it is electrically connected to the semiconductor bare chip 140C. Hence, the electrical characteristic of the semiconductor device 110C is improved so that the VG impedance Z thereof is kept low, and the semiconductor device 110C operates with high reliability at a low operating power supply voltage which is, for example, 1.5 V or 1 V.

Figure 20:
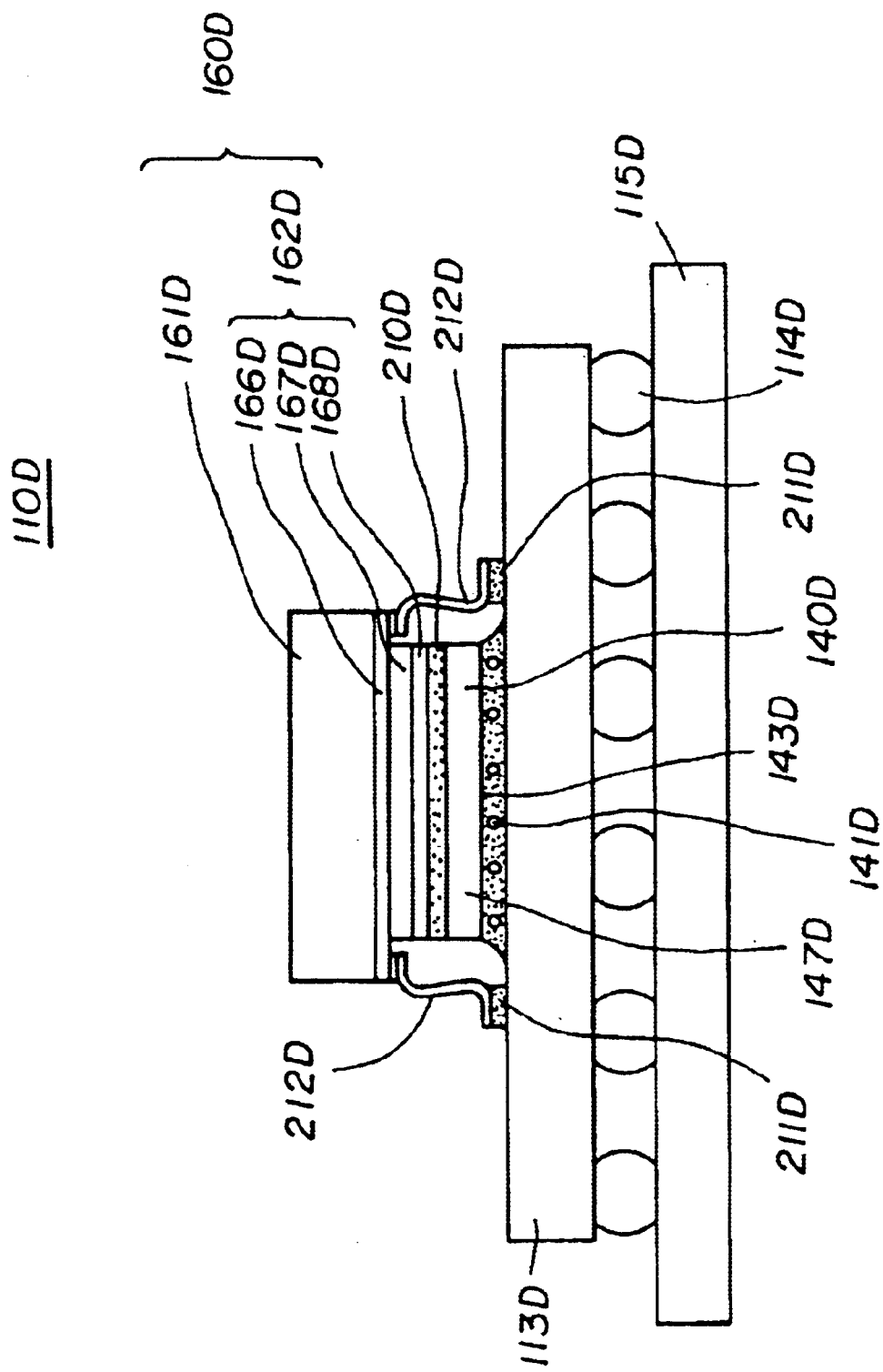
FIG. 20 is a diagram of a fifth preferred embodiment of the semiconductor device according to the present invention.

Next, a description will be given of a fifth preferred embodiment of the semiconductor device according to the present invention with reference to FIG. 20.

A semiconductor device 110D of this embodiment is different from that of the previous embodiment in that the board 161D of the board member 160D with the thin-film capacitor is made of an insulating material although it has a good heat-conducting characteristic. Except the above-mentioned point, the elements of the semiconductor device 110D of this embodiment in FIG. 20 that are essentially the same as corresponding elements in FIG. 18 are designated by the same reference numerals to which the letter D is affixed, and a duplicate description will be omitted.

In the present embodiment, the material of the board 161D is any of aluminum nitride, silicon nitride, silicone carbide, boron nitride and alumina. The semiconductor device 110D is mounted on the main board 115D by using solder balls 114D which are arranged on the back surfaces of the circuit board 113D. The board member 160D with the thin-film structure capacitor has a size that is slightly larger than that of the semiconductor bare chip 140D. The board member 160D is enlarged and the periphery thereof projects from the periphery of the semiconductor bare chip 140D. By using the space between the periphery of the board member 160D and the periphery of the semiconductor bare chip 140D, the power supply terminals 211D on the top surface of the circuit board 113D are electrically connected to the conducting layer 166D by using the flexible terminals 212D. The flexible terminals 212D are provided at two or more locations.

Accordingly, the conducting layer 168D of the thin-film structure capacitor 162D is electrically connected to the grounding layer of the CMOS type LSI circuit structure part 143D through the adhesive agent 210D and the silicon chip board 147D. The conducting layer 166D of the thin-film structure capacitor 162D is electrically connected to the power supply layer of the CMOS type LSI circuit structure part 143D through the pattern of the flexible terminals 212D and the circuit board 113D and the bumps 141D.

Accordingly, similar to the circuit shown in FIG. 7, the inductance of the thin-film structure capacitor 162D is reduced by the CMOS type LSI semiconductor bare chip 140D, and the thin-film structure capacitor 162D is electrically connected to it. Thus, the electrical characteristics are improved so that the VG impedance Z of the semiconductor device 110D is kept low. The semiconductor device 110D of this embodiment operates with high reliability at a low operating power-supply voltage which is, for example, 1.5 V or 1 V.

What is claimed is:

1. A semiconductor device comprising:

a semiconductor bare chip mounted on a circuit board by flip-chip bonding; and a board member including an electrically-insulative board, a protective insulating film formed on a bottom surface of the board, and a thin-film structure capacitor formed on said protective insulating film, the board member being arranged so that the thin-film structure capacitor is bonded to a back surface of the semiconductor bare chip, and the thin-film structure capacitor being electrically connected between a power supply terminal and a grounding terminal of the semiconductor bare chip.

2. A semiconductor device comprising:

a semiconductor bare chip mounted on a circuit board by flip-chip bonding, the semiconductor bare chip having a power supply terminal and a grounding terminal on a back surface thereof; and a board member including an electrically-insulative board, a protective insulating film formed on a bottom surface of the board, and a thin-film structure capacitor formed on said protective insulating film, the thin-film structure capacitor having terminals, on a surface of the capacitor, which correspond to the power supply terminal and the grounding terminal of the semiconductor bare chip, wherein the board member is arranged so that the terminals of the thin-film structure capacitor are electrically connected to the power supply terminal and the grounding terminal of the semiconductor bare chip, and the thin-film structure capacitor is bonded to the back surface of the semiconductor bare chip.

3. The semiconductor device according to claim 2 wherein the semiconductor bare chip includes a plurality of power supply terminals and a plurality of grounding terminals on the back surface thereof, the thin-film structure capacitor having a corresponding number of terminals on the capacitor surface for the plurality of power supply terminals and the plurality of grounding terminals, and the respective terminals of the thin-film structure capacitor electrically connected to the plurality of power supply terminals and the plurality of grounding terminals.

4. The semiconductor device according to claim 1 or 2 further comprising a second capacitor mounted on the circuit board and being electrically connected between the power supply terminal and the grounding terminal of the semiconductor bare chip.

5. The semiconductor device according to claim 1 or 2 wherein the board of the board member with the thin-film structure capacitor is made of a thermally conducting material.

6. The semiconductor device according to claim 1 or 2 wherein the board of the board member with the thin-film structure capacitor is made of a thermally conducting material, and a heat sink is bonded to the board.

7. A board member which is bonded to a back surface of a semiconductor bare chip, the semiconductor bare chip mounted on a circuit board by flip-chip bonding, the semiconductor bare chip having a power supply terminal and grounding terminal on the back surface thereof, the board member comprising:

an electrically-insulative board;

a protective insulating film formed on a bottom surface of the board; and a thin-film structure capacitor formed said protective insulating film, the thin-film structure capacitor having terminals, on a surface of the capacitor, which correspond to the power supply terminal and the grounding terminal of the semiconductor bare chip, wherein the board member is arranged so that the terminals of the thin-film structure capacitor are electrically connected to the power supply terminal and the grounding terminal of the semiconductor bare chip.

* * * * *